United States Patent
Ogawa

(10) Patent No.: US 11,483,498 B2
(45) Date of Patent: Oct. 25, 2022

(54) SOLID IMAGING ELEMENT, CONTROL METHOD FOR SOLID IMAGING ELEMENT, AND ELECTRONIC APPARATUS

(71) Applicant: SONY SEMICONDUCTOR SOLUTIONS CORPORATION, Kanagawa (JP)

(72) Inventor: Koji Ogawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/277,206

(22) PCT Filed: Aug. 28, 2019

(86) PCT No.: PCT/JP2019/033615
§ 371 (c)(1),
(2) Date: Mar. 17, 2021

(87) PCT Pub. No.: WO2020/066432
PCT Pub. Date: Apr. 2, 2020

(65) Prior Publication Data
US 2022/0030186 A1 Jan. 27, 2022

(30) Foreign Application Priority Data

Sep. 28, 2018 (JP) .............................. JP2018-186086

(51) Int. Cl.
*H04N 5/355* (2011.01)
*G01K 1/02* (2021.01)
(Continued)

(52) U.S. Cl.
CPC ............. *H04N 5/355* (2013.01); *G01K 1/026* (2013.01); *G01R 19/16571* (2013.01);
(Continued)

(58) Field of Classification Search
CPC ...... H04N 5/355; H04N 5/3454; H04N 5/361; H04N 5/36963; H04N 5/379; H04N 5/341;
(Continued)

(56) References Cited

U.S. PATENT DOCUMENTS

2009/0279896 A1* 11/2009 Hufstedler ........... H04B 10/272
250/214 R
2016/0094787 A1* 3/2016 Govil .................... G06V 10/955
348/310
(Continued)

FOREIGN PATENT DOCUMENTS

CN 108088560 A 5/2018
CN 108574809 A 9/2018
(Continued)

OTHER PUBLICATIONS

International Search Report and Written Opinion of PCT Application No. PCT/JP2019/033615, dated Nov. 19, 2019, 09 pages of ISRWO.

*Primary Examiner* — Albert H Cutler
(74) *Attorney, Agent, or Firm* — Chip Law Group

(57) ABSTRACT

A solid imaging element (11a) according to an embodiment includes: a light reception element (402) that outputs an electric signal in accordance with incident light, a detection unit (30) that detects whether a change quantity of the electric signal output from the light reception element has exceeded a threshold, and outputs a detection signal expressing a detection result of the detection, a temperature measurement unit (51) that measures temperature, and a setting unit (52) that sets the threshold on the basis of the temperature measured by the temperature measurement unit.

14 Claims, 22 Drawing Sheets

(51) Int. Cl.
    *G01R 19/165* (2006.01)
    *H04N 5/345* (2011.01)
    *H04N 5/361* (2011.01)
    *H04N 5/369* (2011.01)
    *G01J 1/44* (2006.01)
    *H04N 5/341* (2011.01)

(52) U.S. Cl.
    CPC ........... *H04N 5/3454* (2013.01); *H04N 5/361* (2013.01); *H04N 5/36963* (2018.08); *H04N 5/379* (2018.08); *G01J 2001/444* (2013.01)

(58) Field of Classification Search
    CPC .... H04N 5/357; H04N 5/3655; H04N 5/3456; G01K 1/026; G01R 19/16571; G01J 2001/444; H01L 31/107
    See application file for complete search history.

(56) References Cited

U.S. PATENT DOCUMENTS

| | | |
|---|---|---|
| 2018/0146149 A1 | 5/2018 | Suh et al. |
| 2018/0167570 A1* | 6/2018 | Suh ................... H04N 5/341 |
| 2018/0180471 A1* | 6/2018 | Marra ................. G01J 1/4228 |
| 2018/0180473 A1* | 6/2018 | Clemens ................. G01J 1/46 |
| 2018/0262703 A1 | 9/2018 | Kim et al. |

FOREIGN PATENT DOCUMENTS

| | | |
|---|---|---|
| EP | 3324611 A1 | 5/2018 |
| JP | 2017-130761 A | 7/2017 |
| JP | 2017-535999 A | 11/2017 |
| JP | 2018-85725 A | 5/2018 |
| JP | 2018-148553 A | 9/2018 |
| KR | 10-2018-0058162 A | 5/2018 |
| KR | 10-2018-0102976 A | 9/2018 |

* cited by examiner

FIG.13A

FOR $V_{high}$

520

| BIAS SETTING VALUE [a.u.] | TEMPERATURE MEASUREMENT VALUE [a.u.] | | | | | | |
|---|---|---|---|---|---|---|---|
| | 20.0 | 25.0 | 30.0 | 35.0 | 40.0 | 45.0 | 50.0 |
| 10.0 | 4.0 | 4.0 | 3.9 | 3.8 | 3.7 | 3.6 | 3.5 |
| 15.0 | 4.0 | 4.0 | 4.0 | 3.9 | 3.8 | 3.7 | 3.6 |
| 20.0 | 4.0 | 4.0 | 4.0 | 4.0 | 3.9 | 3.8 | 3.7 |
| 25.0 | 4.0 | 4.0 | 4.0 | 4.0 | 4.0 | 3.9 | 3.8 |
| 30.0 | 4.0 | 4.0 | 4.0 | 4.0 | 4.0 | 4.0 | 3.9 |
| 35.0 | 4.0 | 4.0 | 4.0 | 4.0 | 4.0 | 4.0 | 4.0 |
| 40.0 | 4.0 | 4.0 | 4.0 | 4.0 | 4.0 | 4.0 | 4.0 |

(Row label: PHOTOCURRENT MEASUREMENT VALUE [a.u.])

FOR $V_{low}$

521

| BIAS SETTING VALUE [a.u.] | TEMPERATURE MEASUREMENT VALUE [a.u.] | | | | | | |
|---|---|---|---|---|---|---|---|
| | 20.0 | 25.0 | 30.0 | 35.0 | 40.0 | 45.0 | 50.0 |
| 10.0 | 2.0 | 2.0 | 2.1 | 2.2 | 2.3 | 2.4 | 2.5 |
| 15.0 | 2.0 | 2.0 | 2.0 | 2.1 | 2.2 | 2.3 | 2.4 |
| 20.0 | 2.0 | 2.0 | 2.0 | 2.0 | 2.1 | 2.2 | 2.3 |
| 25.0 | 2.0 | 2.0 | 2.0 | 2.0 | 2.0 | 2.1 | 2.2 |
| 30.0 | 2.0 | 2.0 | 2.0 | 2.0 | 2.0 | 2.0 | 2.1 |
| 35.0 | 2.0 | 2.0 | 2.0 | 2.0 | 2.0 | 2.0 | 2.0 |
| 40.0 | 2.0 | 2.0 | 2.0 | 2.0 | 2.0 | 2.0 | 2.0 |

(Row label: PHOTOCURRENT MEASUREMENT VALUE [a.u.])

530

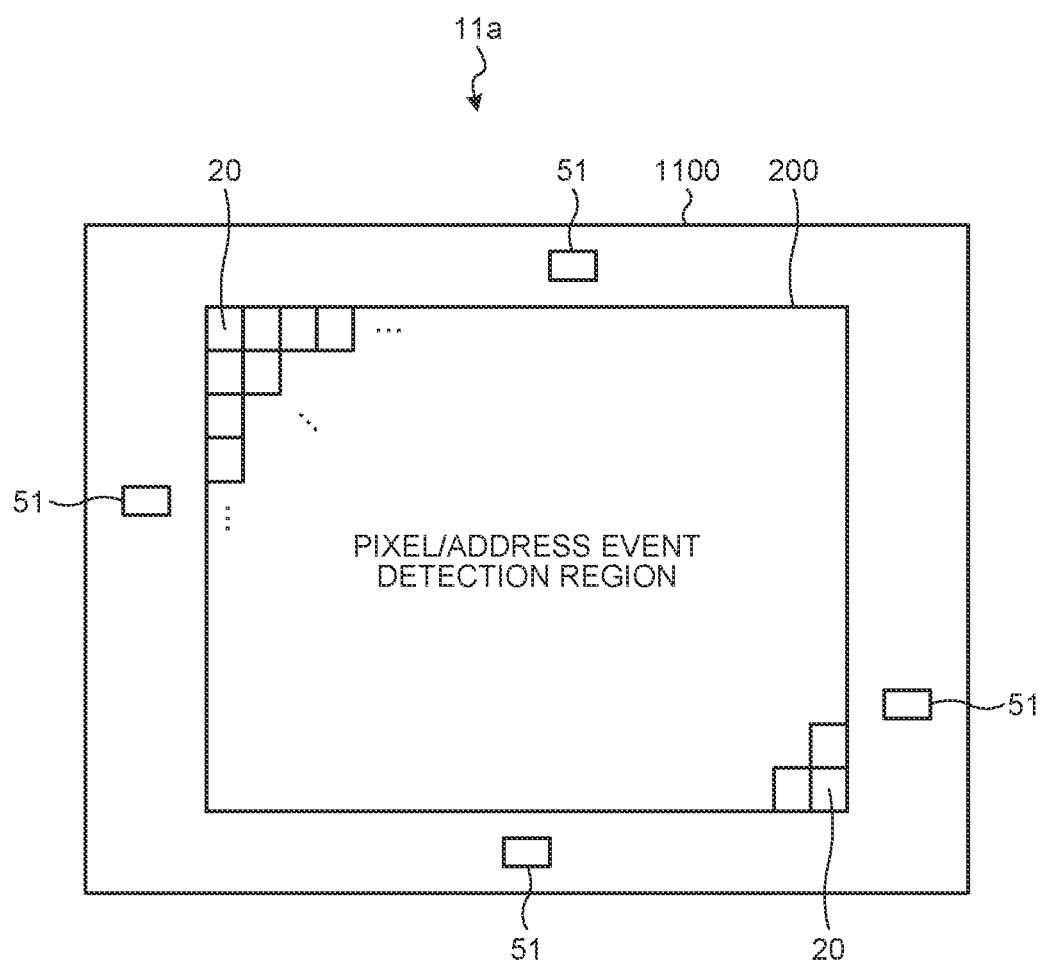

SOLID IMAGING ELEMENT, CONTROL METHOD FOR SOLID IMAGING ELEMENT, AND ELECTRONIC APPARATUS

CROSS REFERENCE TO RELATED APPLICATIONS

This application is a U.S. National Phase of International Patent Application No. PCT/JP2019/033615 filed on Aug. 28, 2019, which claims priority benefit of Japanese Patent Application No. JP 2018-186086 filed in the Japan Patent Office on Sep. 28, 2018. Each of the above-referenced applications is hereby incorporated herein by reference in its entirety.

FIELD

The present invention relates to a solid imaging element, a control method for a solid imaging element, and an electronic apparatus.

BACKGROUND

In a solid imaging device using a complementary metal oxide semiconductor (CMOS) or the like, an asynchronous solid imaging element has been suggested (for example, Patent Literature 1). In the asynchronous solid imaging element, a detection circuit is provided for each pixel, detecting in real time that the light quantity of light received in a pixel has exceeded a threshold as an address event for each pixel address. The solid imaging element that detects the address event for each pixel in this manner is referred to as a dynamic vision sensor (DVS).

By using the asynchronous solid imaging element such as this DVS, the response can be made faster than in a case of using an existing synchronous solid imaging element, which images image data synchronizing with a synchronous signal such as a vertical synchronizing signal.

CITATION LIST

Patent Literatures

Patent Literature 1: Japanese Laid-open Patent Publication (Translation of PCT Application) No. 2017-535999
Patent Literature 2: Japanese Patent Application Laid-open No. 2018-085725

SUMMARY

Technical Problem

In such an asynchronous solid imaging element, the existence of dark current in each pixel deteriorates an I-V conversion characteristic at low luminous intensity of each pixel. The deterioration in I-V conversion characteristic due to the dark current results in the decrease in contrast sensitivity, that is, the sensitivity to contrast.

It is an object of the present disclosure to provide a solid imaging element, a control method for a solid imaging element, and an electronic apparatus, in which a characteristic of the solid imaging element that detects an address event can be improved.

Solution to Problem

For solving the problem described above, a solid imaging element according to one aspect of the present disclosure has a light reception element that outputs an electric signal in accordance with incident light, a detection unit that detects whether a change quantity of the electric signal output from the light reception element has exceeded a threshold, and outputs a detection signal expressing a detection result of the detection, a temperature measurement unit that measures temperature, and a setting unit that sets the threshold on the basis of the temperature measured by the temperature measurement unit.

BRIEF DESCRIPTION OF DRAWINGS

FIG. 13A is a diagram illustrating an example of a table used when a calculation unit obtains a bias setting value in the embodiment.

FIG. 13B is a diagram illustrating an example of a table used when the calculation unit obtains the bias setting value in the embodiment.

FIG. 16C is a diagram illustrating another example of the arrangement of the temperature measurement circuits that is applicable to the embodiment.

DESCRIPTION OF EMBODIMENT

An embodiment of the present disclosure is hereinafter described in detail with reference to the drawings. In each embodiment below, the same part is denoted by the same reference sign and the redundant description is omitted.

Embodiment

Structure Examples Applicable to Embodiment

Figure 1:
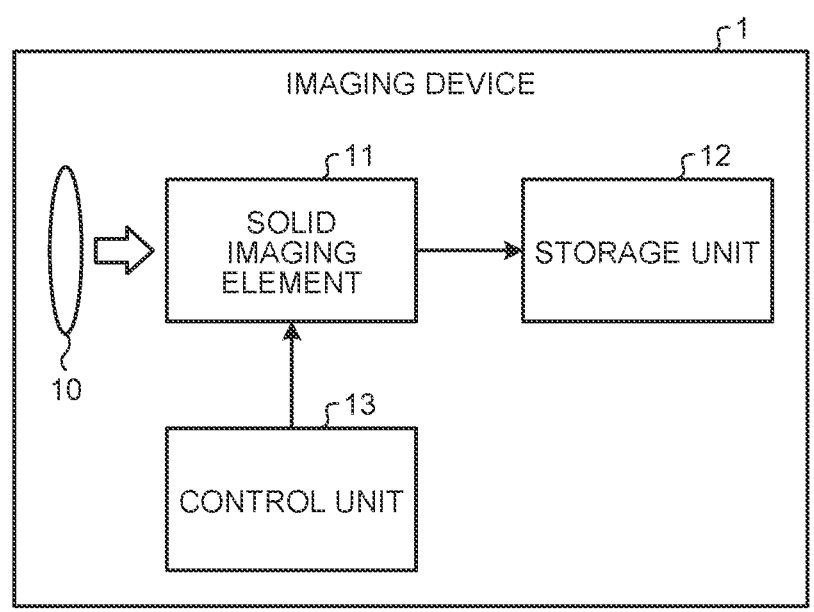
FIG. 1 is a diagram schematically illustrating a structure of one example of an imaging device as an electronic apparatus in which a solid imaging element according to an embodiment is used.

FIG. 1 is a diagram schematically illustrating a structure of one example of an imaging device as an electronic apparatus in which a solid imaging element according to one embodiment is used. In FIG. 1, an imaging device 1 includes an optical system 10, a solid imaging element 11, a storage unit 12, and a control unit 13. The optical system 10 includes one or more lenses, and mechanisms including an auto-focusing mechanism and a diaphragm mechanism. The optical system 10 guides the light from a subject to a light reception surface of the solid imaging element 11.

The solid imaging element 11 includes a plurality of light reception elements that convert incident light into electric signals through photoelectric conversion and output the electric signals, and a driving circuit that drives these light reception elements. The solid imaging element 11 further includes a signal processing unit that performs a predetermined signal process on the electric signals output from the light reception elements and outputs the resulting signals as image data. Moreover, the solid imaging element 11 includes an address event detection unit that detects, for each light reception element, an address event that occurs upon the incidence of light in the light reception element and outputs an event detection signal that has detected the address event.

The storage unit 12 stores, in a storage medium, the image data and the event detection signal (event detection data) output from the solid imaging element 11. The storage unit 12 can employ a nonvolatile storage medium such as a flash memory or a hard disk drive. Alternatively, a volatile storage medium such as a dynamic random access memory (DRAM) can be used as the storage medium.

The control unit 13 controls the solid imaging element 11 so that the solid imaging element 11 performs an imaging operation of outputting the aforementioned image data.

Figure 2:
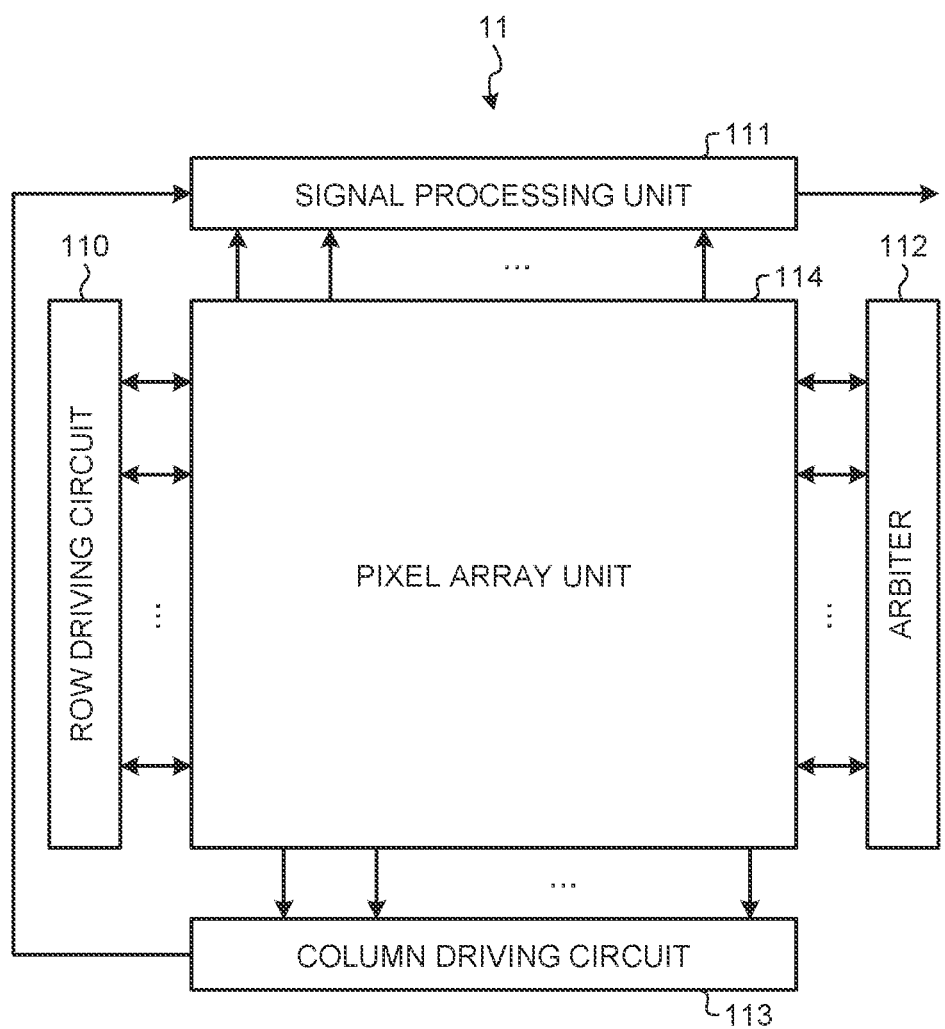
FIG. 2 is a block diagram illustrating a structure of one example of the solid imaging element that is applicable to the embodiment.

FIG. 2 is a block diagram illustrating a structure of one example of the solid imaging element 11 that is applicable to the embodiment. As illustrated in FIG. 2, the solid imaging element 11 includes a row driving circuit 110, a signal processing unit 111, an arbiter 112, a column driving circuit 113, and a pixel array unit 114.

The pixel array unit 114 has a plurality of pixels arranged in a two-dimensional lattice form. The arrangement in a horizontal direction is hereinafter referred to as "row" and the arrangement in a direction perpendicular to the row is hereinafter referred to as "column" in FIG. 2.

Each of the pixels in the pixel array unit 114 generates an analog signal of voltage corresponding to photocurrent as a pixel signal. In addition, each pixel detects the presence or absence of the address event depending on whether the change quantity of the photocurrent has exceeded a predetermined threshold. Each pixel outputs a request to the arbiter 112 in accordance with the occurrence of the address event.

The arbiter 112 arbitrates the request from each pixel and transmits the response to the request to the pixel on the basis of the arbitration result. The pixel having received the response supplies an event detection signal expressing the detection result to the row driving circuit 110 and the signal processing unit 111.

The row driving circuit 110 drives each pixel so as to output the pixel signal to the column driving circuit 113. The column driving circuit 113 includes an AD (Analog to Digital) converter for each column and a driving circuit that scans the AD converter for each column in the row direction. The AD converter for each column is referred to as a column AD converter (ADC). The column driving circuit 113 scans the column ADCs in the row direction, thereby outputting the pixel signals, which are converted into digital signals by the respective AD converters, in the unit of rows.

The pixel signal output from the column driving circuit 113 is supplied to the signal processing unit 111. The signal processing unit 111 performs a predetermined signal process, such as a CDS (Correlated Double Sampling) process or a AGC (Auto Gain Control) process, on the digital pixel signal supplied from the column driving circuit 113. In addition, the signal processing unit 111 performs the signal process, such as an image recognition process, on the event detection signal. The signal processing unit 111 supplies the data expressing the process result and the event detection signal to the storage unit 120.

Figure 3:
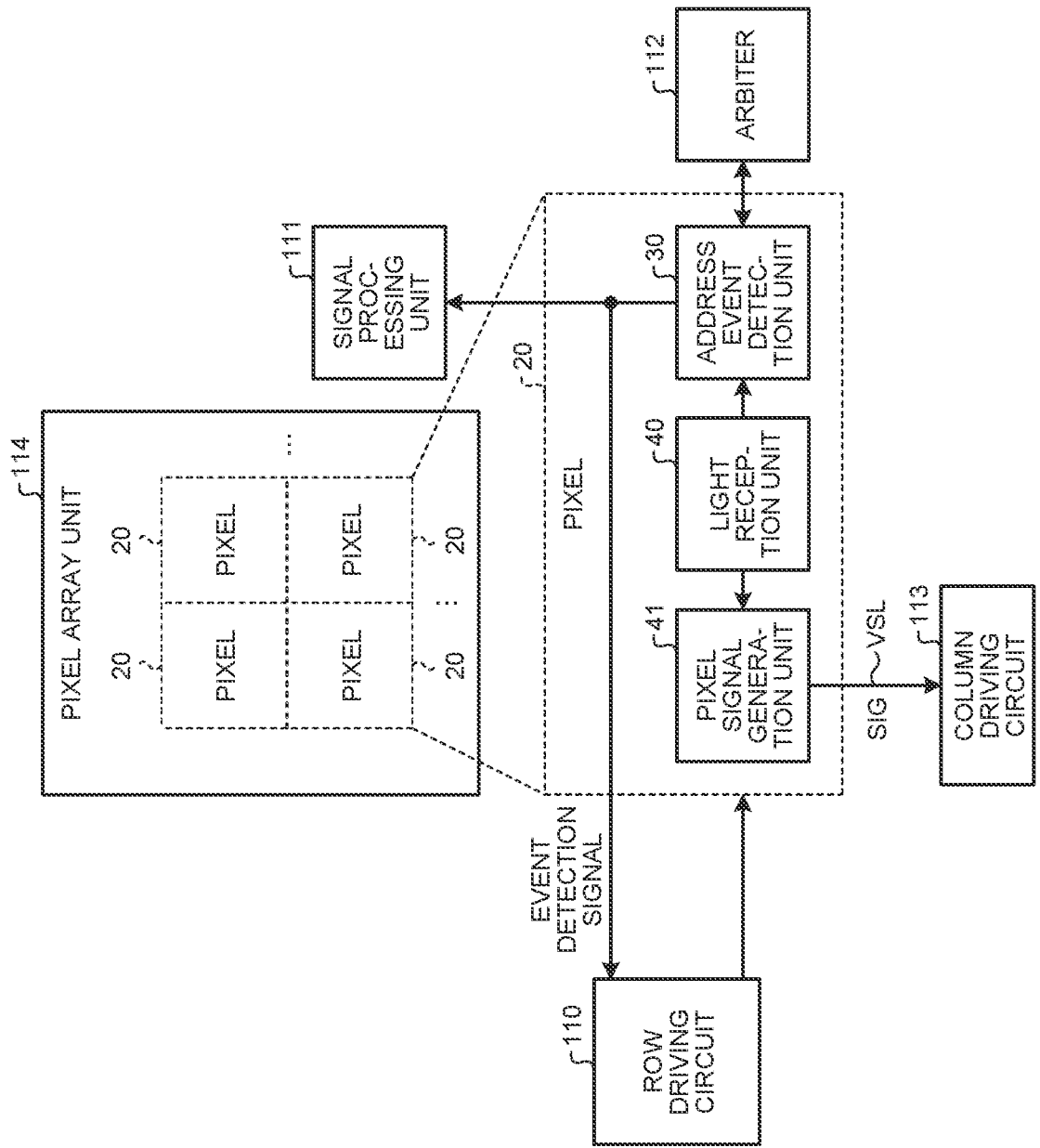
FIG. 3 is a block diagram illustrating a structure of one example of a pixel array unit that is applicable to the embodiment.

FIG. 3 is a block diagram illustrating a structure of one example of the pixel array unit 114 that is applicable to the embodiment. As illustrated in an upper part of FIG. 3, the pixel array unit 114 includes a plurality of pixels 20 that are arranged in a two-dimensional lattice form. As illustrated in a lower part of FIG. 3, each pixel 20 includes an address event detection unit 30, a light reception unit 40, and a pixel signal generation unit 41.

The light reception unit 40 includes a light reception element and generates photocurrent by photoelectric conversion of the incident light. The light reception unit 40 supplies the generated photocurrent to any of the pixel signal generation unit 41 and the address event detection unit 30 in accordance with the control of the row driving circuit 110.

The pixel signal generation unit 41 generates the signal of the voltage corresponding to the photocurrent supplied from the light reception unit 40, as a pixel signal SIG. The pixel signal generation unit 41 supplies the generated pixel signal SIG to the column driving circuit 113 through a vertical signal line VSL.

The address event detection unit 30 determines whether the change quantity of photocurrent supplied from the light reception unit 40 has exceeded the threshold, and detects the presence or absence of the address event on the basis of the determination result. The address event includes, for example, a (+) event expressing that the change quantity of photocurrent has exceeded an ON threshold and a (−) event expressing that the change quantity of photocurrent has become lower than an OFF threshold. The event detection signal expressing the detection of the address event includes, for example, one bit expressing the result of detecting the (+) event and one bit expressing the result of detecting the (−) event. Note that the address event detection unit 30 can detect only the (+) event.

Upon the detection of the occurrence of the address event, the address event detection unit 30 requests the arbiter 112 to transmit the event detection signal expressing the occurrence of the address event. The address event detection unit 30 having received the response to this request from the arbiter 112 supplies the address detection signal to the row driving circuit 110 and the signal processing unit 111.

Figure 4:
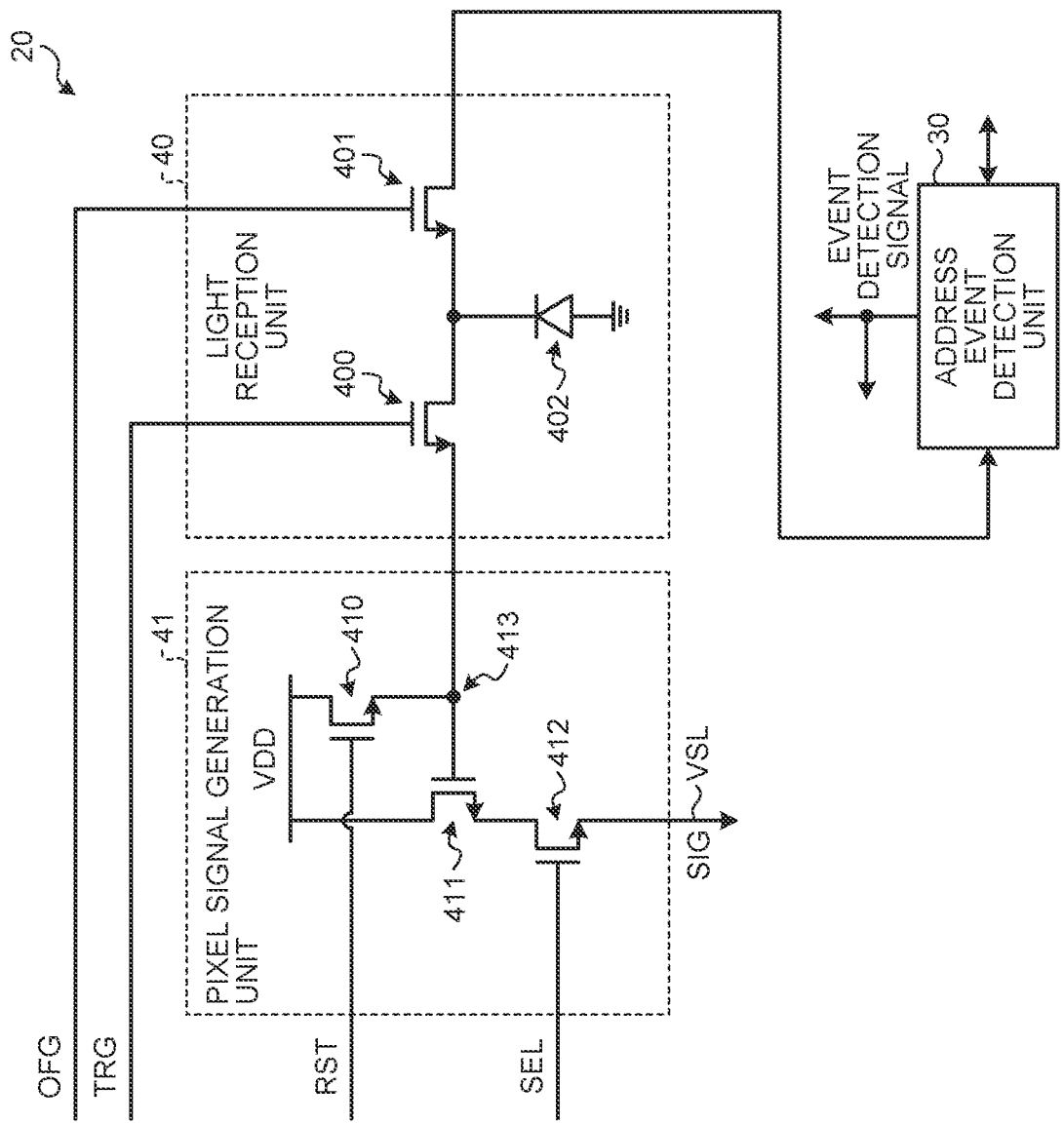
FIG. 4 is a diagram illustrating more specifically a structure of a pixel that is applicable to the embodiment.

FIG. 4 is a diagram illustrating more specifically a structure of the pixel 20 that is applicable to the embodiment. In the pixel 20, the pixel signal generation unit 41 includes a reset transistor 410, an amplification transistor 411, a selection transistor 412, and a floating diffusion layer 413. The reset transistor 410, the amplification transistor 411, and the selection transistor 412 are each formed using an N-type metal-oxide-semiconductor (MOS) transistor, for example.

In the pixel signal generation unit 41, the floating diffusion layer 413 accumulates charges and generates voltage corresponding to the amount of accumulated charges. The reset transistor 410 initializes the amount of charges in the floating diffusion layer 413 in accordance with a reset signal RST supplied from the row driving circuit 110. The amplification transistor 411 amplifies the voltage of the floating diffusion layer 413. In accordance with a selection signal SEL from the row driving circuit 110, the selection transistor 412 outputs, as the pixel signal SIG, the signal of the voltage amplified by the amplification transistor 411 to the column driving circuit 113 through the vertical signal line VSL.

In the pixel 20, the light reception unit 40 includes a transfer transistor 400, an over flow gate (OFG) transistor 401, and a photoelectric conversion element 402. The transfer transistor 400 and the OFG transistor 401 are, for example, N-type MOS transistors.

In the light reception unit 40, the row driving circuit 110 supplies a transfer signal TRG to the transfer transistor 400. In addition, the row driving circuit 110 supplies a control signal OFG to the OFG transistor 401. The photoelectric conversion element 402 is a light reception element that performs photoelectric conversion of incident light and generates charges. The transfer transistor 400 transfers the charges from the photoelectric conversion element 402 to the floating diffusion layer 413 in accordance with the transfer signal TRG. The OFG transistor 401 supplies the electric signal that is generated by the photoelectric conversion element 402 to the address event detection unit 30 in accordance with the control signal OFG. Here, the electric signal supplied from the photoelectric conversion element 402 is the photocurrent formed by the charges.

When the control unit 130 has ordered to start the detection of the address event, the row driving circuit 110 drives to turn on (close) the OFG transistors 401 in all the pixels 20 by the control signal OFG. Thus, the photocurrent output from the photoelectric conversion element 402 is supplied to the address event detection unit 30.

Upon the detection of the address event by the address event detection unit 30 in a certain pixel 20, the row driving circuit 110 drives to turn off (open) the OFG transistor 401 in that pixel 20 and stops the supply of the photocurrent from the photoelectric conversion element 402 to the address event detection unit 30. Next, the row driving circuit 110 drives to turn on the transfer transistor 400 by the transfer signal TRG and transfers the charges (photocurrent) output from the photoelectric conversion element 402 to the floating diffusion layer 413.

Thus, the solid imaging element 11 outputs the pixel signal of the pixel 20 where the address event is detected to the column driving circuit 113 selectively. Accordingly, as compared to the case in which the pixel signals of all the pixels are output regardless of the presence or absence of the address event, the consumption power of the solid imaging element 11 or the processing amount in the image processing can be reduced.

Figure 5:
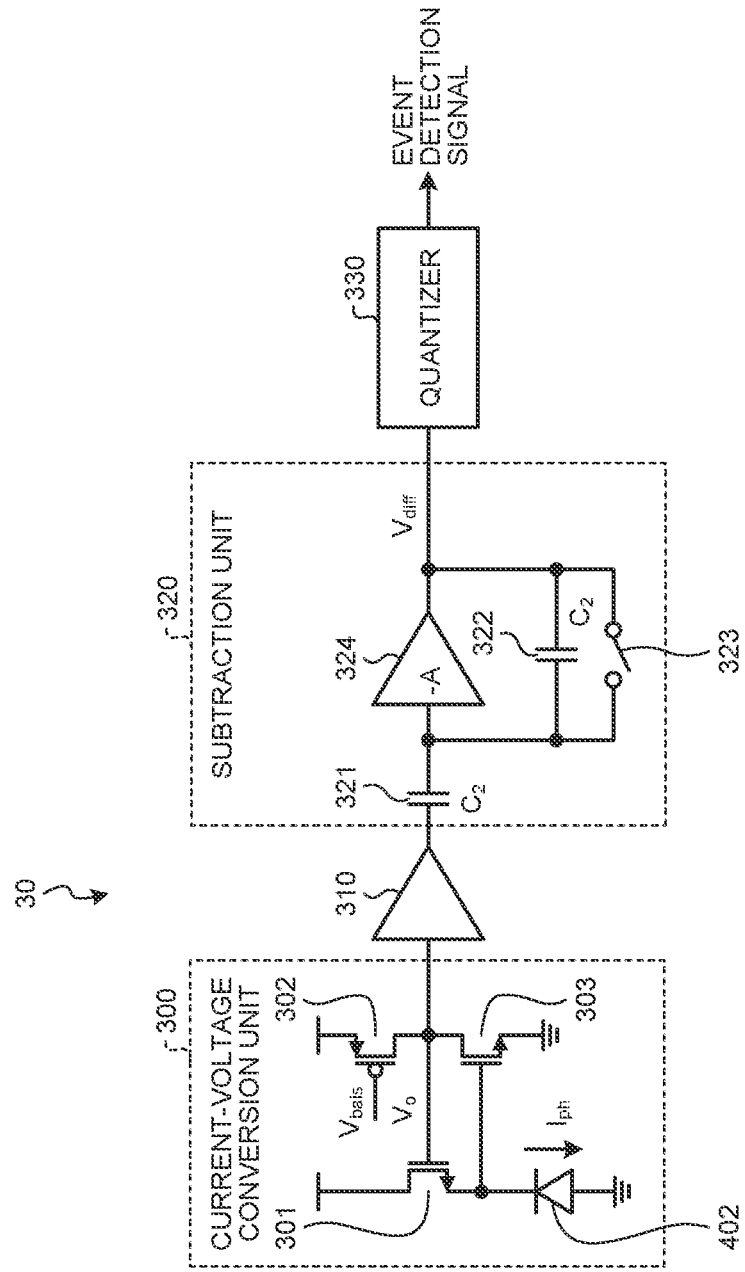
FIG. 5 is a diagram illustrating more specifically an address event detection unit that is applicable to the embodiment.

FIG. 5 is a diagram illustrating more specifically a structure of the address event detection unit 30 that is applicable to the embodiment. In FIG. 5, the address event detection unit 30 includes a current-voltage conversion unit 300, a buffer amplifier 310, a subtraction unit 320, and a quantizer 330.

The current-voltage conversion unit 300 includes transistors 301 and 303 that are formed by N-type MOS transistors, and a transistor 302 that is formed by a P-type MOS transistor. Here, the photoelectric conversion element 402 is a photodiode. In FIG. 5, for explanation, the photoelectric conversion element 402 is included in the current-voltage conversion unit 300. However, in fact, the photoelectric conversion element 402 is included in the light reception unit 40 and the OFG transistor 401 is connected between a connection point between a source of the transistor 301 and a gate of the transistor 303, and a cathode of the photoelectric conversion element 402 as described with reference to FIG. 4.

The source of the N-type transistor 301 is connected to the photoelectric conversion element 402 and a drain thereof is connected to a power source terminal. The P-type transistor 302 and the N-type transistor 303 are connected in series between the power source terminal and a ground terminal. In addition, a connection point between a drain of the transistor 302 and a drain of the transistor 303 is connected to a gate of the transistor 301 and an input terminal of the buffer amplifier 310. To a gate of the transistor 302, a predetermined bias voltage $V_{bias}$ is applied.

The drains of the N-type transistors 301 and 303 are connected to the power source side, and form source followers. The two source followers connected in a loop shape convert the photocurrent output from the photoelectric conversion element 402 into a voltage signal of a logarithm thereof. In addition, the transistor 302 supplies constant current to the transistor 303.

The voltage signal resulting from the conversion of the photocurrent output from the photoelectric conversion element 402 into voltage by the current-voltage conversion unit 300 is supplied to the subtraction unit 320 through the buffer amplifier 310. The subtraction unit 320 includes capacitors 321 and 322 with capacitances $C_1$ and $C_2$, respectively, a switch unit 323, and an inverter 324.

The capacitor 321 has one end connected to an output terminal of the buffer amplifier 310 and the other end connected to an input end of the inverter 324. The capacitor 322 is connected in parallel to the inverter 324. The switch unit 323 switches a route connecting both ends of the capacitor 322 between an on state and an off state in accordance with a row driving signal. The inverter 324 inverts the voltage signal input through the capacitor 321. The inverter 324 supplies the inverted signal to the quantizer 330.

When the switch unit 323 is turned on, a voltage signal $V_{init}$, which is the output signal of the buffer amplifier 310, is input to the buffer amplifier 310 side of the capacitor 321 and the inverter 324 side of the capacitor 321 serves as a virtual ground terminal. The potential of this virtual ground terminal is regarded as zero for the convenience. Here, the charge $Q_{init}$ accumulated in the capacitor 321 is expressed by the following Expression (1) on the basis of the capacitance $C_1$ of the capacitor 321. On the other hand, the charge accumulated in the capacitor 322 is zero because both ends are short-circuited by the switch unit 323.

$$Q_{init}=C_1 \times V_{init} \tag{1}$$

Next, it is assumed that the switch unit 323 is turned off and the voltage on the buffer amplifier 310 side of the capacitor 321 changes into $V_{after}$. In this case, the charge $Q_{after}$ accumulated in the capacitor 321 is expressed by the following Expression (2).

$$Q_{after}=C_1 \times V_{after} \tag{2}$$

On the other hand, a charge $Q_2$ accumulated in the capacitor 322 is expressed by the following Expression (3) in which $V_{out}$ is the output voltage of the inverter 324.

$$Q_2=-C_2 \times V_{out} \tag{3}$$

Here, since the total amount of charges in the capacitors 321 and 322 does not change, the relation of the following Expression (4) is satisfied.

$$Q_{init}=Q_{after}+Q_2 \tag{4}$$

Substituting Expressions (1) to (3) for Expression (4) to modify obtains the following Expression (5).

$$V_{out}=-(C_1/C_2) \times (V_{after}-V_{init}) \tag{5}$$

Expression (5) expresses the operation of subtracting the voltage signal and the gain of the subtraction result is the capacitance ratio $C_1/C_2$ of the capacitor 321 to the capacitor 322. Usually, it is desirable to maximize the gain and therefore, it is preferable to design so that the capacitance $C_1$ of the capacitor 321 is larger and the capacitance $C_2$ of the capacitor 322 is smaller. On the other hand, when the capacitance $C_2$ of the capacitor 322 is too small, the kTC noise may increase and the noise characteristic may deteriorate. In view of this, the reduction of the capacitance $C_2$ of the capacitor 322 is restricted to the range where the noise can be allowed. In addition, since the address event detection unit 30 including the subtraction unit 320 is mounted in each pixel 20, the capacitances $C_1$ and $C_2$ of the capacitors 321 and 322 are restricted in terms of area. In consideration of these, the values of the capacitances $C_1$ and $C_2$ of the capacitors 321 and 322 are determined.

The quantizer 330 detects, using two thresholds of the ON threshold and the OFF threshold, three states of the (+) event, the (−) event, and no event detected. Therefore, the quantizer 330 is referred to as a 1.5-bit quantizer. The structure of the quantizer 330 is described below.

Event Detection Process Applicable to Embodiment

Figure 6:
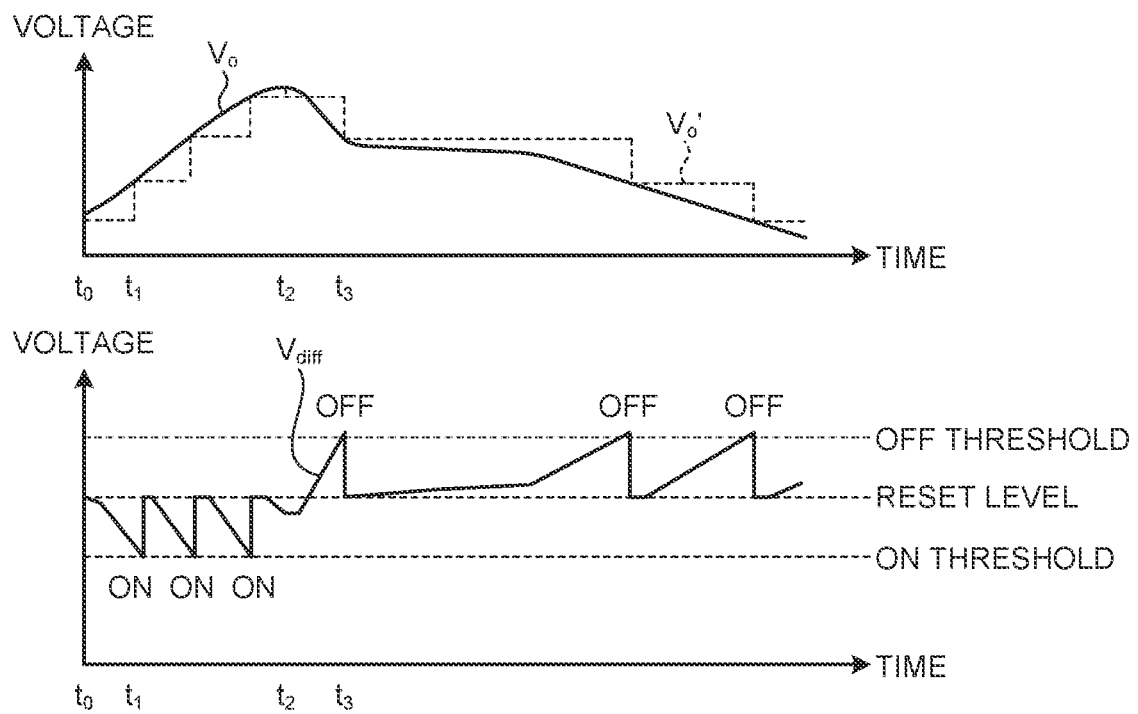
FIG. 6 is a diagram for describing an operation of the address event detection unit.

FIG. 6 is a diagram for describing the operation of the address event detection unit 30 illustrated in FIG. 5. In an upper part and a lower part of FIG. 6, the horizontal axis expresses time and the vertical axis expresses voltage. The upper part of FIG. 6 illustrates an example of an output voltage Vo of the current-voltage conversion unit 300. The lower part of FIG. 6 illustrates how voltage $V_{diff}$, which is the output voltage of the subtraction unit 320, changes in accordance with the output voltage Vo on the upper side. The voltage $V_{diff}$ corresponds to the voltage $V_{out}$ in Expression (5) described above.

In the lower part of FIG. 6, the OFF threshold and the ON threshold are the thresholds for the voltage $V_{diff}$ for detecting the (−) event and the (+) event, respectively. When the voltage $V_{diff}$ has become more than the OFF threshold in a positive direction, the (+) event is sensed, and when the voltage $V_{diff}$ has become more than the ON threshold in a negative direction, the (−) event is sensed. When the voltage $V_{diff}$ is less than the OFF threshold and more than the ON threshold, the event is not detected.

The output voltage Vo output from the current-voltage conversion unit 300 is input to the subtraction unit 320 through the buffer amplifier 310. First, description is made of the case in which the amount of reception light in the photoelectric conversion element 402 increases and the output voltage Vo output from the current-voltage conversion unit 300 increases.

For the explanation, in FIG. 6, a time point to is immediately after the switch unit 323 is changed from the on state to the off state in the subtraction unit 320. That is to say, when the switch unit 323 is turned on, both ends of the capacitor 322 are short-circuited and the capacitor 322 is reset. When the capacitor 322 is reset, the voltage $V_{diff}$ of the output of the subtraction unit 320 becomes a reset level. Immediately after the voltage $V_{diff}$ of the output of the subtraction unit 320 becomes a reset level, the row driving circuit 110 turns off the switch unit 323.

It is assumed that the output voltage Vo increases from this time point $t_0$, and at a time point $t_1$, the voltage $V_{diff}$, which is the difference from the output voltage Vo at the time point $t_0$, becomes more than the ON threshold in the negative direction. In this case, the quantizer 330 outputs the event detection signal expressing the detection of the (+) event. Along with this, the row driving circuit 110 turns on the switch unit 323 in accordance with this event detection signal and the output of the subtraction unit 320 becomes the reset level. Immediately after the output of the subtraction unit 320 becomes the reset level, the row driving circuit 110 turns off the switch unit 323.

Next, description is made of the case in which the amount of light reception in the photoelectric conversion element 402 decreases and the output voltage Vo output from the current-voltage conversion unit 300 decreases. In the example illustrated in the upper part of FIG. 6, the output voltage Vo changes from the increase to the decrease at a time point $t_2$, and at a time point $t_3$, the difference between the output voltage Vo at that time point and the output voltage Vo when it is determined that the voltage has exceeded the threshold (in this case, ON threshold) immediately before the time point $t_3$ is more than the OFF threshold in the positive direction. Thus, the event detection signal expressing the detection of the (−) event is output from the quantizer 330. In addition, in accordance with this event detection signal, the switch unit 323 is turned on by the row driving circuit 110 and the output of the subtraction unit 320 becomes the reset level. The row driving circuit 110 turns off the switch unit 323 immediately after the output of the subtraction unit 320 becomes the reset level.

By comparing the difference of the output voltage Vo of the current-voltage conversion unit 300 with the ON threshold and the OFF threshold as described above, the address event detection unit 30 can output the event detection signal according to the change in light quantity of the light received in the photoelectric conversion element 402.

Note that in the upper part of FIG. 6, voltage Vo' is obtained by rewriting the change of the output voltage Vo of the current-voltage conversion unit 300 in accordance with the lower part in FIG. 6, that is, the output of the quantizer 330. In other words, the quantizer 330 detects the rise and fall of the change of the voltage Vo' for every ON threshold and OFF threshold on the basis of the determination result from the ON threshold and the OFF threshold based on the voltage $V_{diff}$ and the change of the voltage Vo'.

Known Influence of Dark Current on Output of Photoelectric Conversion Element

Figure 7:
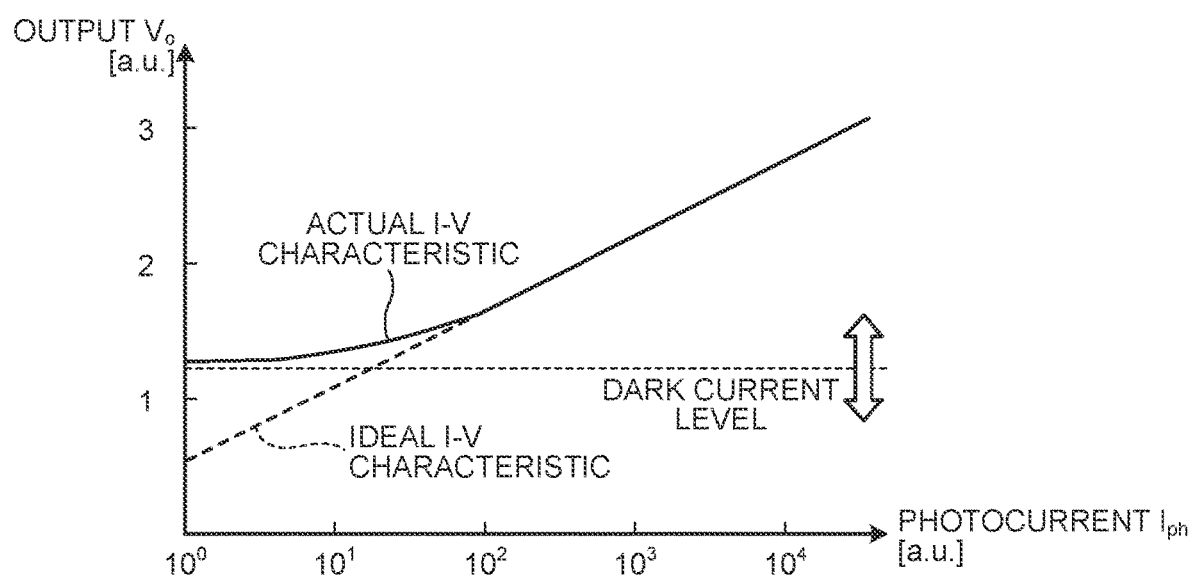
FIG. 7 is a diagram illustrating an example of the relation between output of a photoelectric conversion element and output of a current-voltage conversion unit.

FIG. 7 is a diagram illustrating an example of the relation (I-V characteristic) between the output of the photoelectric conversion element 402 and the output of the current-voltage conversion unit 300. In FIG. 7, the horizontal axis expresses the photocurrent $I_{ph}$ output from the photoelectric conversion element 402, and the vertical axis expresses the output voltage Vo resulting from the conversion of the photocurrent $I_{ph}$ into voltage in the current-voltage conversion unit 300.

It is ideal that the I-V characteristic of the output voltage Vo of the current-voltage conversion unit 300 changes linearly to the change of the photocurrent $I_{ph}$ as expressed by the ideal I-V characteristic in FIG. 7. However, in fact, the photocurrent $I_{ph}$ output from the photoelectric conversion element 402 includes many components by the dark current particularly in a region with the low luminous intensity. Therefore, as expressed by the actual I-V characteristic in FIG. 7, the characteristic of the output voltage Vo becomes non-linear in the region with the low luminous intensity where the light quantity of the incidence light is small because of the dark current of the photoelectric conversion element 402, and becomes the voltage with the dark current level corresponding to the current-voltage conversion result with respect to the dark current. That is to say, in the region with the low luminous intensity, the tilt of the I-V characteristic becomes small.

In addition, the dark current of the photoelectric conversion element 402 has temperature dependence, and the dark current level varies depending on the temperature of the photoelectric conversion element 402. The dark current of the photoelectric conversion element 402 generally increases in proportion to the increase in ambient temperature.

In this manner, the tilt of the I-V characteristic of the output voltage Vo of the current-voltage conversion unit 300 according to the output current of the photoelectric conversion element 402 decreases in the region with the low luminous intensity, and the characteristic deteriorates. Therefore, in the region with the low luminous intensity, the contrast sensitivity of the event detection signal output from the address event detection unit 30 decreases. The degree of the decrease of the contrast sensitivity changes depending on the temperature of the photoelectric conversion element 402.

More specifically, in the example illustrated in the upper part of FIG. 6 described above, the response to the change of the output voltage Vo with respect to the change in light quantity becomes dull at or below a predetermined voltage, and the sensitivity in determination for the ON threshold and the OFF threshold deteriorates. For example, in the region with the low luminous intensity, the range of the ON threshold or the OFF threshold becomes wide, the ON threshold or the OFF threshold that should be detected becomes undetectable, or other problems may occur.

Structure Example of Solid Imaging Element According to Embodiment

In the embodiment, a temperature measurement unit that measures temperature is provided on a substrate (semiconductor chip) where the photoelectric conversion element 402 is disposed, and the values of the ON threshold and the OFF threshold are set in accordance with the temperature measured by this temperature measurement unit. Thus, the temperature dependence of the influence of the dark current on the I-V characteristic of the output voltage Vo of the current-voltage conversion unit 300 can be corrected and the deterioration in contrast sensitivity due to the dark current can be suppressed.

As illustrated in FIG. 7, the influence of the dark current on the I-V characteristic also depends on the photocurrent $I_{ph}$ output from the photoelectric conversion element 402. Therefore, in the embodiment, the photocurrent $I_{ph}$ output from one or more photoelectric conversion elements 402 is measured and by using the measurement result additionally, the ON threshold and the OFF threshold are set. Thus, by setting the values of the ON threshold and the OFF threshold on the basis of the temperature measured by the temperature measurement unit and the measurement value of the measured photocurrent $I_{ph}$, the temperature dependence of the influence of the dark current on the I-V characteristic of the output voltage Vo can be corrected with higher accuracy.

Figure 8:
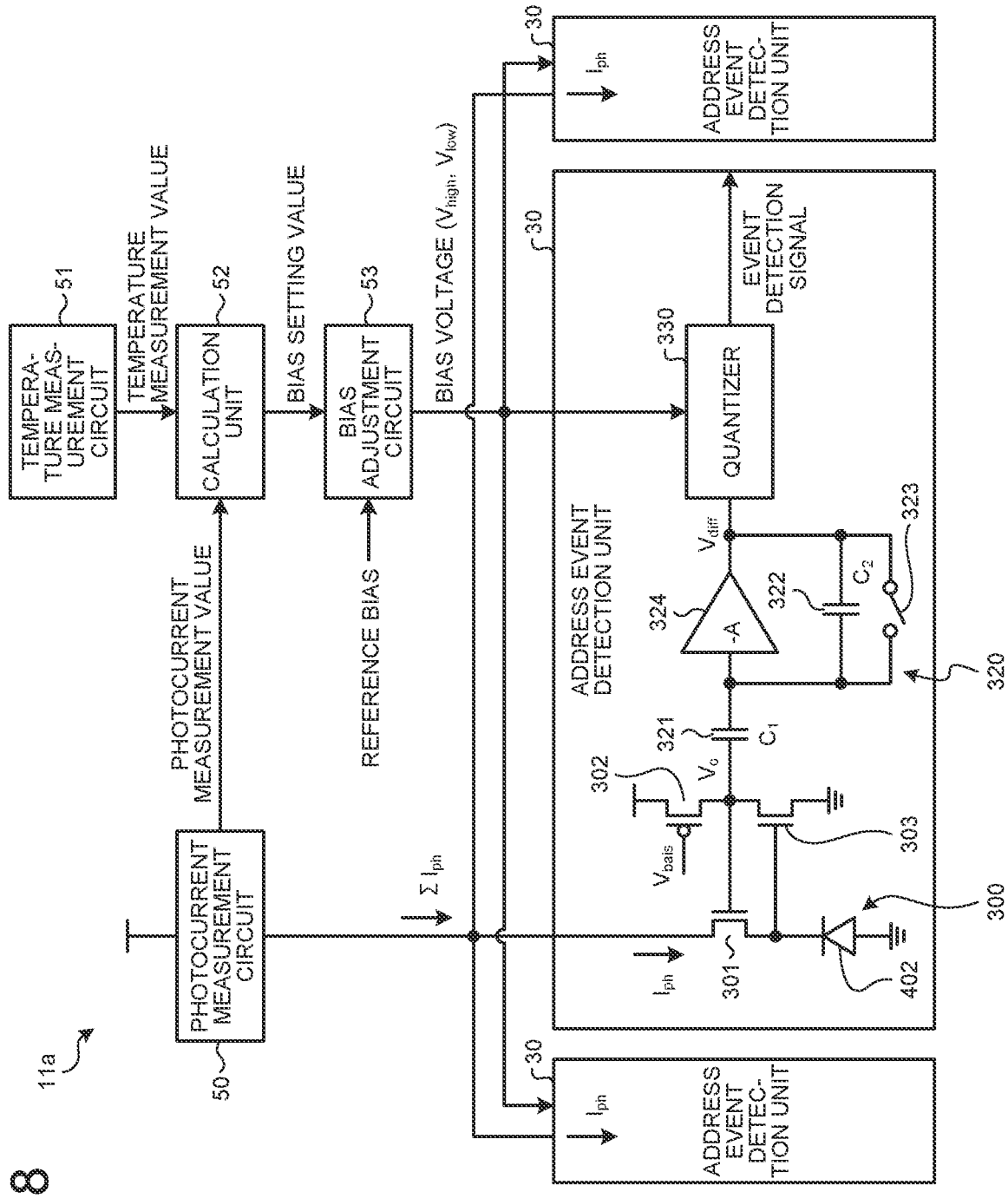
FIG. 8 is a diagram illustrating a structure of one example of the solid imaging element according to the embodiment.

FIG. 8 is a diagram illustrating a structure of one example of the solid imaging element according to the embodiment. Note that FIG. 8 mainly illustrates a part of the entire structure of the solid imaging element that is related to the description of the embodiment. In the above description, the solid imaging element 11 includes the pixel signal generation unit 41; however, the embodiment may exclude the pixel signal generation unit 41. The description about the pixel signal generation unit 41 is omitted as appropriate.

In FIG. 8, a solid imaging element 11a according to the embodiment includes one or more address event detection units 30, a photocurrent measurement circuit 50, a temperature measurement circuit 51, a calculation unit 52, and a bias adjustment circuit 53.

In the one or more address event detection units 30, drains of transistors 301 included therein are connected and the power is supplied from a power source terminal common to a connection point. The photocurrent measurement circuit 50 is inserted between the power source terminal and the connection point connecting the drains of the transistors 301 in the address event detection units 30, and measures the total current $\Sigma I_{ph}$ of the photocurrent $I_{ph}$ flowing in the transistors 301. The photocurrent measurement value based on the total current $\Sigma I_{ph}$ measured by the photocurrent measurement circuit 50 is supplied to the calculation unit 52.

Figure 9A:
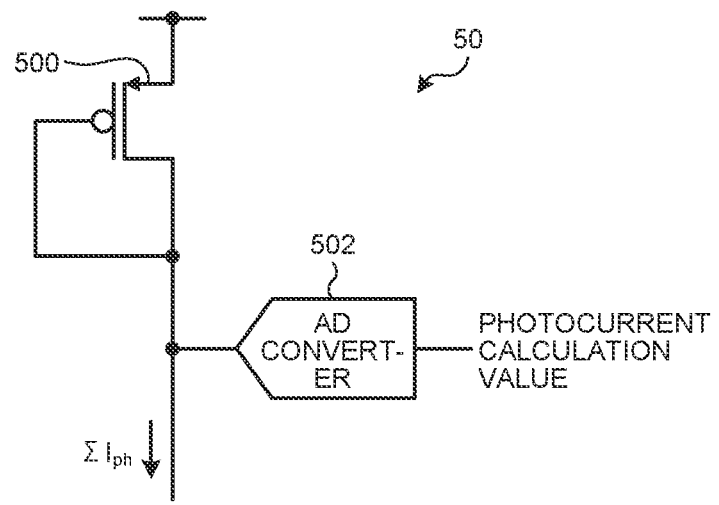
FIG. 9A is a diagram illustrating an example of a photocurrent measurement circuit that is applicable to the embodiment.
Figure 9B:
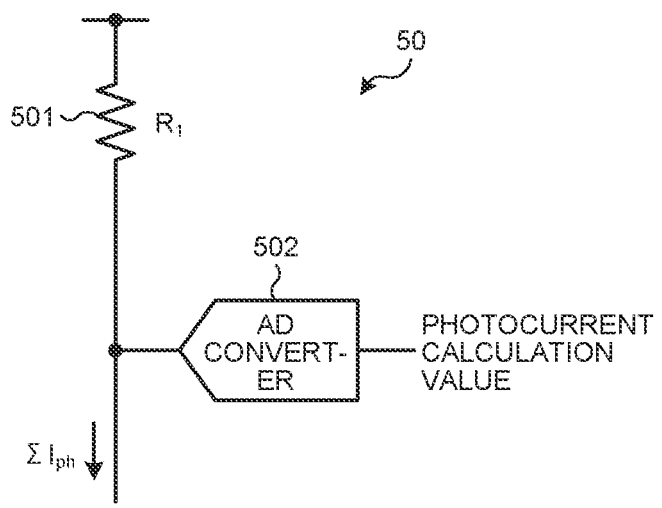
FIG. 9B is a diagram illustrating an example of the photocurrent measurement circuit that is applicable to the embodiment.

FIGS. 9A and 9B are diagrams each illustrating an example of the photocurrent measurement circuit 50 applicable to the embodiment. FIG. 9A is a diagram illustrating an example of the photocurrent measurement circuit 50 formed using a diode-connected MOS transistor. The photocurrent measurement circuit 50 illustrated in FIG. 9A forms diode connection by inversely connecting a drain and a gate of a transistor 500 that is a P-type MOS transistor. A source of the transistor 500 is connected to the power source terminal, and a connection point between the drain and the gate is connected to the connection point connecting the drains of the transistors 301 of the address event detection units 30.

The power source terminal is common to the address event detection units 30 and therefore, between the source and the drain of the transistor 500, the total current $\Sigma I_{ph}$ of the photocurrent $I_{ph}$ flowing in the transistors 301 of the address event detection units 30 flows. The voltage value resulting from the conversion of the total current $\Sigma I_{ph}$ by the on resistance of the transistor 500 is output as the photocurrent measurement value that is converted into the digital value in an AD converter 502 connected to the drain of the transistor 500.

FIG. 9B is a diagram illustrating an example of the photocurrent measurement circuit 50 formed using a resistor. In the example of the photocurrent measurement circuit 50 illustrated in FIG. 9B, a resistor 501 with a resistance value $R_1$ is inserted between the power source terminal and the connection point connecting the drains of the transistors 301 in the address event detection units 30. In this example, the power source terminal is also common to the address event detection units 30; therefore, the total current $\Sigma I_{ph}$ of the photocurrent $I_{ph}$ flowing in the transistors 301 of the address event detection units 30 flows in the resistor 501. The voltage value resulting from the conversion of the total current $\Sigma I_{ph}$ by the resistor 501 is converted into the digital value in the AD converter 502, and output as the photocurrent measurement value.

In order to express that the photocurrent measurement value is the total of the photocurrent $I_{ph}$ flowing in the transistors 301, the photocurrent measurement value output from the photocurrent measurement circuit 50 is described as the photocurrent measurement value $\Sigma I_{ph}$ unless otherwise stated.

Back to the description with reference to FIG. 8, the temperature measurement circuit 51 is a circuit that measures the temperature of the target. The temperature measurement circuit 51 is provided on the substrate (semiconductor chip) where the pixel array unit 114 is formed, in the periphery of the pixel array unit 114, for example, at the positions corresponding to the four corners, and measures the temperature of these positions.

Figure 10A:
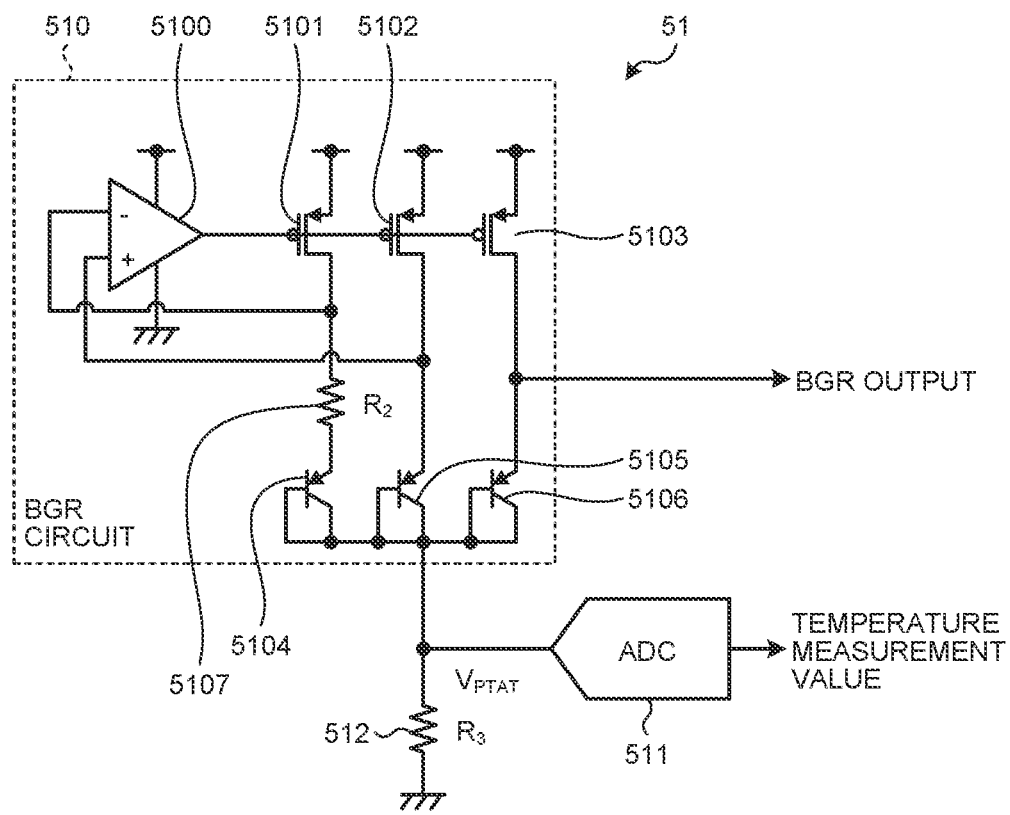
FIG. 10A is a diagram illustrating an example of a temperature measurement circuit that is applicable to the embodiment.
Figure 10B:
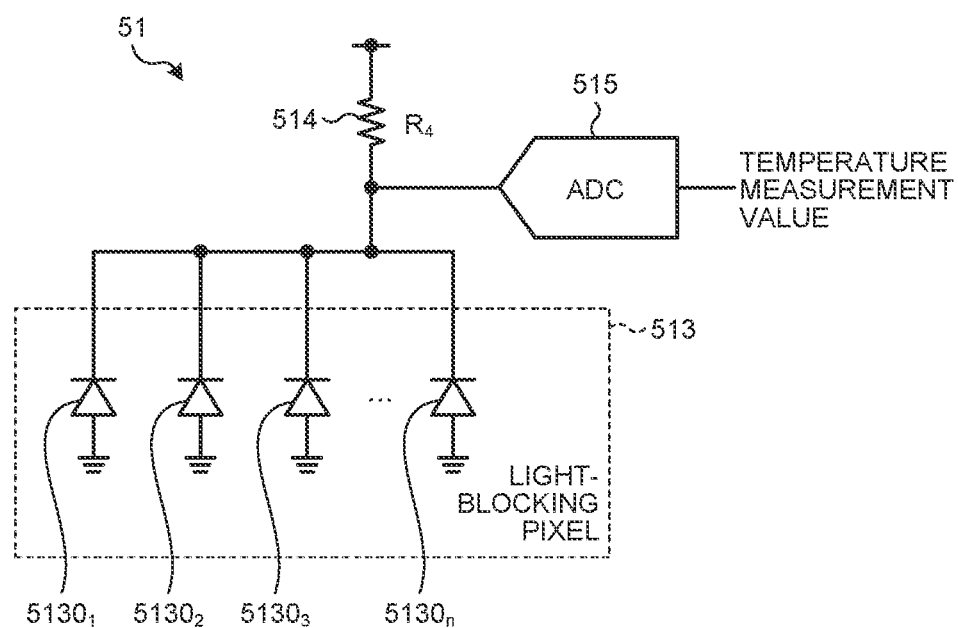
FIG. 10B is a diagram illustrating an example of the temperature measurement circuit that is applicable to the embodiment.

FIGS. 10A and 10B are diagrams each illustrating an example of the temperature measurement circuit 51 applicable to the embodiment. FIG. 10A is a diagram illustrating an example of the temperature measurement circuit 51 using a general bandgap reference circuit (hereinafter abbreviated as a BGR circuit). A BGR circuit 510 illustrated in FIG. 10A includes an operational amplifier 5100, transistors 5101, 5102, and 5103 that are N-type MOS transistors whose gates are inverted input, transistors 5104, 5105, and 5106 that are diode-connected, and a resistor 5107 with a resistance value R2.

In the BGR circuit 510 in FIG. 10A, the output of the operational amplifier 5100 is connected to a gate of the inverted input of each of the transistors 5101, 5102, and 5103. In addition, a source of each of the transistors 5101, 5102, and 5103 are connected to the power source terminal. The transistor 5101 has a drain connected to one end of the resistor 5107. A connection point between the drain of the transistor 5101 and the one end of the resistor 5107 is connected to a negative input end of the operational amplifier 5100. The other end of the resistor 5107 is connected to an emitter of the diode-connected transistor 5104. The transistor 5102 has a drain connected to the emitter of the diode-connected transistor 5104. The connection point between the drain and the emitter of the transistor 5104 is connected to a positive input end of the operational amplifier 5100. The transistor 5103 has a drain connected to an emitter of the diode-connected transistor 5106. From the connection point between the drain and the emitter of the transistor 5106, the BGR output that is the constant-voltage output by the BGR circuit 510 is extracted.

In the BGR circuit 510 in FIG. 10A, equal current I is output from the drains of the transistors 5101 and 5102, and the current I output from the drain of the transistor 5101 is supplied to the emitter of the transistor 5104 through the resistor 5107. The current I output from the drain of the transistor 5102 is supplied to the emitter of the transistor 5105. When the base-emitter voltages of the transistors 5104 and 5105 are voltage $V_{BE2}$ and $V_{BE1}$, respectively, a voltage $\Delta V_{BE}$ corresponding to the difference between the voltage $V_{BE1}$ and the voltage $V_{BE2}$ is applied between terminals of a resistor 5017 as expressed by the following Expression (6).

$$V_{BE1} = V_{BE2} + \Delta V_{BE} \qquad (6)$$

The current I flowing in the circuit can be expressed by the following Expression (7) using only the voltage $\Delta V_{BE}$ and the resistance value $R_2$ of the resistor 5107.

$$I = \Delta V_{BE}/R_2 \qquad (7)$$

The transistor 5103 copies the current I and supplies the copied current I to the diode-connected transistor 5106, so that the BGR output voltage not depending on the power source voltage can be extracted from the connection point between the drain of the transistor 5103 and the emitter of the transistor 5106. At this time, when the transistors 5104 and 5106 have the same characteristic, the voltage $V_{BE1}$ is extracted as the BGR output voltage.

Here, the voltage $\Delta V_{BE}$ has a positive temperature dependence that the voltage increases as the temperature increases in accordance with the characteristic of the diode (transistor 5104). Therefore, when the temperature dependence of the resistance value $R_2$ of the resistor 5107 is sufficiently small, measuring the current I enables the measurement of the temperature.

In the example illustrated in FIG. 10A, each of the transistors 5104, 5105, and 5106 has a base and a collector thereof grounded through a resistor 512 with a resistance value $R_3$. Here, one end of the resistor 512 that is different from the grounded end is connected to an input end of the AD converter 511 and the current I is input to the AD converter 511. The AD converter 511 converts the voltage value $V_{PTAT}$ resulting from the conversion of the current I in accordance with the resistance value $R_3$ into the digital value and outputs the digital value as a temperature measurement value T.

Note that in FIG. 10A, the BGR circuit 510 may be provided exclusively for the temperature measurement, and a BGR circuit used for the constant-voltage generation in the solid imaging element 11a may be used as the BGR circuit 510. In the case of providing the BGR circuit 510 exclusively for measuring the temperature, the transistors 5103 and 5106 for extracting the BGR output voltage can be omitted from the circuit illustrated in FIG. 10A.

FIG. 10B is a diagram illustrating an example of the temperature measurement circuit 51 that measures the temperature using the temperature dependence of the dark current in the photoelectric conversion element. In FIG. 10B, the temperature measurement circuit 51 includes a light-blocking pixel 513, a resistor 514 with a resistance value R4, and an AD converter 515. The light-blocking pixel 513 is formed by shielding one or more photoelectric conversion elements $5130_1$, $5130_2$, $5103_3$, ..., $5103n$ that are connected in parallel, from light so that the light does not enter these elements.

The resistor 514 has one end connected to the power source and the other end connected to an input end of the AD converter 515, and moreover connected to cathodes of the photoelectric conversion elements $5130_1$, $5130_2$, $5103_3$, ..., $5103n$ that are connected in parallel. Anodes of the photoelectric conversion elements $5130_1$, $5130_2$, $5103_3$, ..., $5103_n$ are grounded.

Since the photoelectric conversion elements $5130_1$, $5130_2$, $5103_3$, ..., $5103_n$ are shielded from light, only the dark current flows. This dark current is converted into voltage by the resistance value $R_4$ of the resistor 514, and input to the AD converter 515. The AD converter 515 converts the input voltage value resulting from the conversion of the dark current supplied from the light-blocking pixel 513 into the digital value, and outputs the digital value as the temperature measurement value T.

The temperature measurement value T measured by the temperature measurement circuit 51 is supplied to the calculation unit 52. The calculation unit 52 obtains a bias setting value for setting the ON threshold and the OFF threshold that the quantizer 330 uses to detect the event on the basis of the photocurrent measurement value supplied from the photocurrent measurement circuit 50 and the temperature measurement value T supplied from the temperature measurement circuit 51.

Here, the calculation unit 52 calculates the average of the photocurrent measurement values $\Sigma I_{ph}$ supplied from the photocurrent measurement circuit 50 among the transistors 301, and uses this average. The average of the photocurrent measurement values $\Sigma I_{ph}$ is hereinafter referred to as a photocurrent measurement value $AVG(\Sigma I_{ph})$. Alternatively, the calculation unit 52 may directly use the photocurrent measurement value $\Sigma I_{ph}$ supplied from the photocurrent measurement circuit 50.

In a case where the solid imaging element 11a includes a plurality of temperature measurement circuits 51, the calculation unit 52 calculates the average of the temperature measurement values T supplied from these temperature measurement circuits 51, and uses the obtained average. The average of the temperature measurement values T among the temperature measurement circuits 51 is hereinafter referred to as a temperature measurement value $T_{AVG}$.

In the embodiment, the calculation unit 52 obtains the bias setting value on the basis of the temperature measurement value $T_{AVG}$ and the photocurrent measurement value $AVG(\Sigma I_{ph})$ using a table that is stored in advance. Here, the calculation unit 52 stores the table about each of the ON threshold and the OFF threshold.

Figure 11:
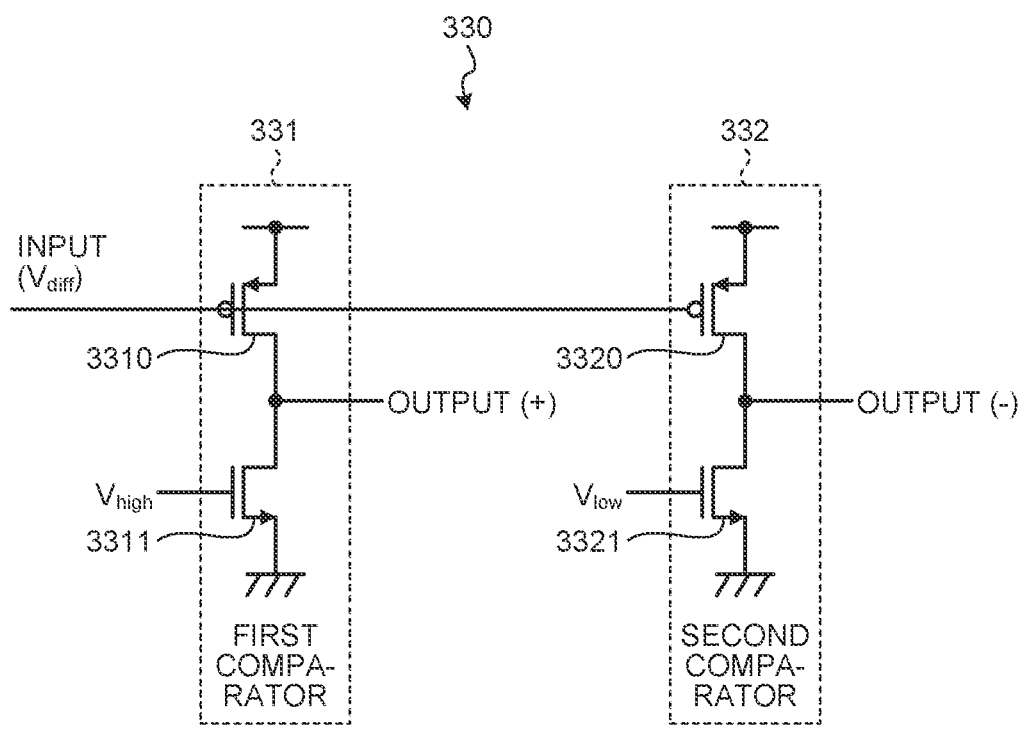
FIG. 11 is a diagram illustrating a structure of one example of a quantizer according to the embodiment.

Here, the quantizer 330 that performs the determination based on the ON threshold and the OFF threshold is described. FIG. 11 is a diagram illustrating a structure of one example of the quantizer 330 according to the embodiment. In FIG. 11, the quantizer 330 includes a first comparator 331 that performs the determination based on the ON threshold and a second comparator 332 that performs the determination based on the OFF threshold.

The first comparator 331 includes a transistor 3310 that is a P-type MOS transistor, and a transistor 3311 that is an N-type MOS transistor. The transistor 3310 has a source connected to the power source and a drain connected to a drain of the transistor 3311. The transistor 3311 has a source grounded. To a gate of the transistor 3310, the voltage $V_{diff}$ that is the output voltage of the subtraction unit 320 is inverted and supplied. To a gate of the transistor 3311, a bias voltage $V_{high}$ for setting the ON threshold is supplied. From the connection point connecting the drain of the transistor 3310 and the drain of the transistor 3311, the output of detecting the (+) event is extracted.

The structure of the second comparator 332 is substantially the same as the structure of the first comparator 331. That is to say, the second comparator 332 includes a transistor 3320 that is a P-type MOS transistor and a transistor 3321 that is an N-type MOS transistor. The transistor 3320 has a source connected to the power source and a drain connected to a drain of the transistor 3321. The transistor 3321 has a source grounded. The voltage $V_{diff}$ that is the output voltage of the subtraction unit 320 is inverted and supplied to a gate of the transistor 3320 in common to the gate of the transistor 3310 described above. To a gate of the transistor 3321, a bias voltage $V_{low}$ for setting the OFF threshold is supplied. From the connection point connecting the drain of the transistor 3320 and the drain of the transistor 3321, the output of detecting the (−) event is extracted.

Figure 12:
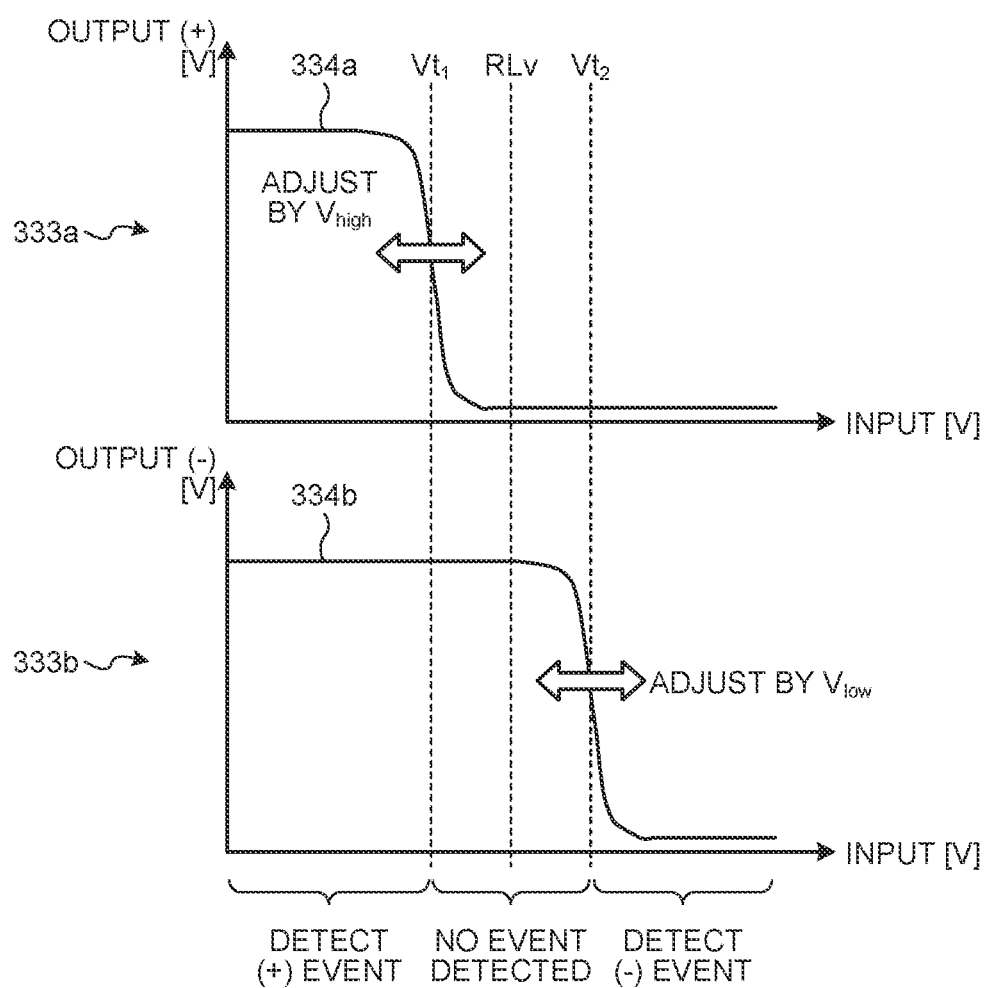
FIG. 12 is a diagram illustrating examples of characteristics of a first comparator and a second comparator.

FIG. 12 is a diagram illustrating an example of the characteristics of the first comparator 331 and the second comparator 332 described above. In FIG. 12, a chart 333a expresses a characteristic example of the first comparator 331 and a chart 333b expresses a characteristic example of the second comparator 332. In the chart 333a and the chart 333b, the horizontal axis represents the input voltage (voltage $V_{diff}$) to the transistors 3310 and 3320 and the vertical axis represents the output voltage from the first comparator 331 and the second comparator 332.

The first comparator 331 has a characteristic that the output voltage sharply decreases after the input voltage ($V_{diff}$) exceeds a threshold $Vt_1$ as expressed by a characteristic line 334a in the chart 333a. Here, the threshold $Vt_1$ is the ON threshold and can be adjusted by the bias voltage $V_{high}$. Specifically, as the bias voltage $V_{high}$ is increased, the threshold $Vt_1$ decreases and as the bias voltage $V_{high}$ is decreased, the threshold $Vt_1$ increases. In the example illustrated in FIG. 6, for example, when the bias voltage $V_{high}$ is decreased, the voltage of the ON threshold increases (becomes close to the reset level).

The second comparator 332 has a characteristic that the output voltage sharply decreases after the input voltage ($V_{diff}$) exceeds a threshold $Vt_2$ as expressed by a characteristic line 334b in the chart 333b. Here, the threshold $Vt_2$ is the OFF threshold and can be adjusted by the bias voltage $v_{low}$. Specifically, as the bias voltage $v_{low}$ is increased, the threshold $Vt_2$ decreases and as the bias voltage $V_{low}$ is decreased, the threshold $Vt_2$ increases. In the example illustrated in FIG. 6, for example, when the bias voltage $V_{low}$ is increased, the voltage of the OFF threshold decreases (becomes close to the reset level).

As illustrated in FIG. 12, when the input voltage (voltage $V_{diff}$) is less than the threshold $Vt_1$, the (+) event is detected and when the input voltage (voltage $V_{diff}$) is the threshold $Vt_2$, the (−) event is detected. In addition, when the input voltage (voltage $V_{diff}$) is the threshold $Vt_1$ or more and the threshold $Vt_2$ or less, the event is not detected.

That is to say, by decreasing the bias voltage $V_{high}$ and increasing the bias voltage $V_{low}$, the ON threshold and the OFF threshold become close to the reset level and the (+) event and the (−) event can be detected with higher sensitivity. Thus, in the region with the low luminous intensity where the actual I-V characteristic and the ideal I-V characteristic do not coincide in FIG. 7, the bias voltage $V_{high}$ is decreased and the bias voltage $V_{low}$ is increased; accordingly, the deterioration of the I-V characteristic in the region with the low luminous intensity can be corrected.

FIG. 13A and FIG. 13B are diagrams each illustrating an example of a table for the calculation unit 52 to obtain the bias setting value in the embodiment. FIG. 13A illustrates an example of a table 520 for setting the ON threshold. FIG. 13B illustrates an example of a table 521 for setting the OFF threshold. The tables 520 and 521 are two-dimensional tables in which the photocurrent measurement values AVG ($\Sigma I_{ph}$) and the temperature measurement values $T_{AVG}$ are associated with the bias setting value.

Note that in FIGS. 13A and 13B, the photocurrent measurement values AVG($\Sigma$Iph), the temperature measurement values TAVG, and the bias setting value are the values in the arbitrary units ([a.u.]). The bias setting values in FIG. 13A correspond to the bias voltage Vhigh and the bias setting values in FIG. 13B correspond to the bias voltage Vlow.

As illustrated in FIG. 13A, in the table 520, when the temperature measurement value $T_{AVG}$ is low, the bias setting value is a fixed value. As the photocurrent measurement value AVG($\Sigma I_{ph}$) becomes higher, the lower limit of the temperature measurement value $T_{AVG}$ in which this bias setting value is the fixed value also increases. On the other hand, when the temperature measurement value $T_{AVG}$ is higher than the lower limit, the bias setting value decreases as the temperature measurement value $T_{AVG}$ increases. When the temperature measurement value $T_{AVG}$ is higher than the lower limit, the bias setting value decreases as the photocurrent measurement value AVG($\Sigma I_{ph}$) decreases.

In FIG. 13A, a border 530 connecting the lower limit of the temperature measurement value $T_{AVG}$ in which the bias setting value is the fixed value when the photocurrent measurement value AVG($\Sigma I_{ph}$) is the lowest, and the lower limit of the highest temperature measurement value $T_{AVG}$ is considered. In this case, the bias setting value is the fixed value in a lower left region of the border 530. In an upper right region of the border 530, the bias setting value changes in accordance with the temperature measurement value $T_{AVG}$ and the photocurrent measurement value AVG($\Sigma I_{ph}$).

The example in FIG. 13B is similar to FIG. 13A described above. That is to say, in the table 521, when the temperature measurement value $T_{AVG}$ is low, the bias setting value is the fixed value. As the photocurrent measurement value AVG ($\Sigma I_{ph}$) increases, the lower limit of the temperature measurement value $T_{AVG}$ in which this bias setting value is the fixed value decreases. On the other hand, when the temperature measurement value $T_{AVG}$ is higher than the lower limit, the bias setting value increases as the temperature measurement value $T_{AVG}$ increases. When the temperature measurement value $T_{AVG}$ is higher than the lower limit, the bias setting value increases as the photocurrent measurement value AVG($\Sigma I_{ph}$) decreases.

In FIG. 13B, a border 531 connecting the lower limit of the temperature measurement value $T_{AVG}$ in which the bias setting value is the fixed value when the photocurrent measurement value AVG($\Sigma I_{ph}$) is the lowest, and the lower limit of the highest temperature measurement value $T_{AVG}$ is considered. In this case, the bias setting value is the fixed value in a lower left region of the border 531. In an upper right region of the border 531, the bias setting value changes in accordance with the temperature measurement value $T_{AVG}$ and the photocurrent measurement value AVG($\Sigma I_{ph}$).

The calculation unit 52 refers to the tables 520 and 521 in accordance with the photocurrent measurement value AVG ($\Sigma I_{ph}$) based on the value supplied from the photocurrent measurement circuit 50 and the temperature measurement value $T_{AVG}$ based on the value supplied from the temperature measurement circuit 51. The calculation unit 52 acquires the bias setting value for setting the ON threshold from the table 520, and acquires the bias setting value for setting the OFF threshold from the table 521.

As one example, a case in which the photocurrent measurement value AVG($\Sigma I_{ph}$) with a value of "20.0 [a.u.]" and the temperature measurement value $T_{AVG}$ with a value of "45.0 [a.u.]" are supplied to the calculation unit 52 is considered. In this case, the calculation unit 52 acquires the bias setting value "3.8 [a.u.]" for setting the threshold $Vt_1$ with reference to the table 520. The calculation unit 52 acquires the bias setting value "2.2 [a.u.]" for setting the threshold $Vt_2$ with reference to the table 521. The bias setting value acquired from the table 520 is referred to as a first bias setting value and the bias setting value acquired from the table 521 is referred to as a second bias setting value as appropriate.

Note that the calculation unit 52 outputs the first bias setting value and the second bias setting value as an 8-bit value, for example. Here, the calculation unit 52 expresses the first bias setting value and the second bias setting value by the number of bits with a value of "1" among the eight bits. In this case, the first bias setting value and the second bias setting value are expressed as a value in nine stages. For example, the calculation unit 52 uses, as the first bias setting value and the second bias setting value, the value obtained by expressing in binary numbers, "255", "127", "63", "31", "15", "7", "3", "1", and "0" that are decimal numbers.

The first bias setting value and the second bias setting values are not limited to these examples, and the position of the bit of the value "1" is not limited as long as the number of bits of the value "1" included in the eight bits is 0 to 8.

Note that the calculation unit 52 includes a nonvolatile memory that stores the tables 520 and 521 in advance. Moreover, the calculation unit 52 includes a processor that calculates the photocurrent measurement value AVG($\Sigma I_{ph}$) and the temperature measurement value $T_{AVG}$ on the basis of the values supplied from the photocurrent measurement circuit 50 and the temperature measurement circuit 51, and refers to the tables 520 and 521 on the basis of the photocurrent measurement value AVG($\Sigma I_{ph}$) and the temperature measurement value $T_{AVG}$ obtained by the calculation.

The calculation unit 52 supplies the first bias setting value and the second bias setting value acquired with reference to the tables 520 and 521 to the bias adjustment circuit 53. The bias adjustment circuit 53 generates the bias voltages $V_{high}$ and $V_{low}$ on the basis of the first bias setting value and the second bias setting value supplied from the calculation unit 52.

Although the tables 520 and 521 associate the photocurrent measurement value AVG($\Sigma I_{ph}$), the temperature measurement value $T_{AVG}$, and the bias setting value in the above description, this is not limited to this example. For example, each of the tables 520 and 521 may be a simple one in which the photocurrent measurement value AVG($\Sigma I_{ph}$) and the bias setting value are associated with each other.

Figure 14:
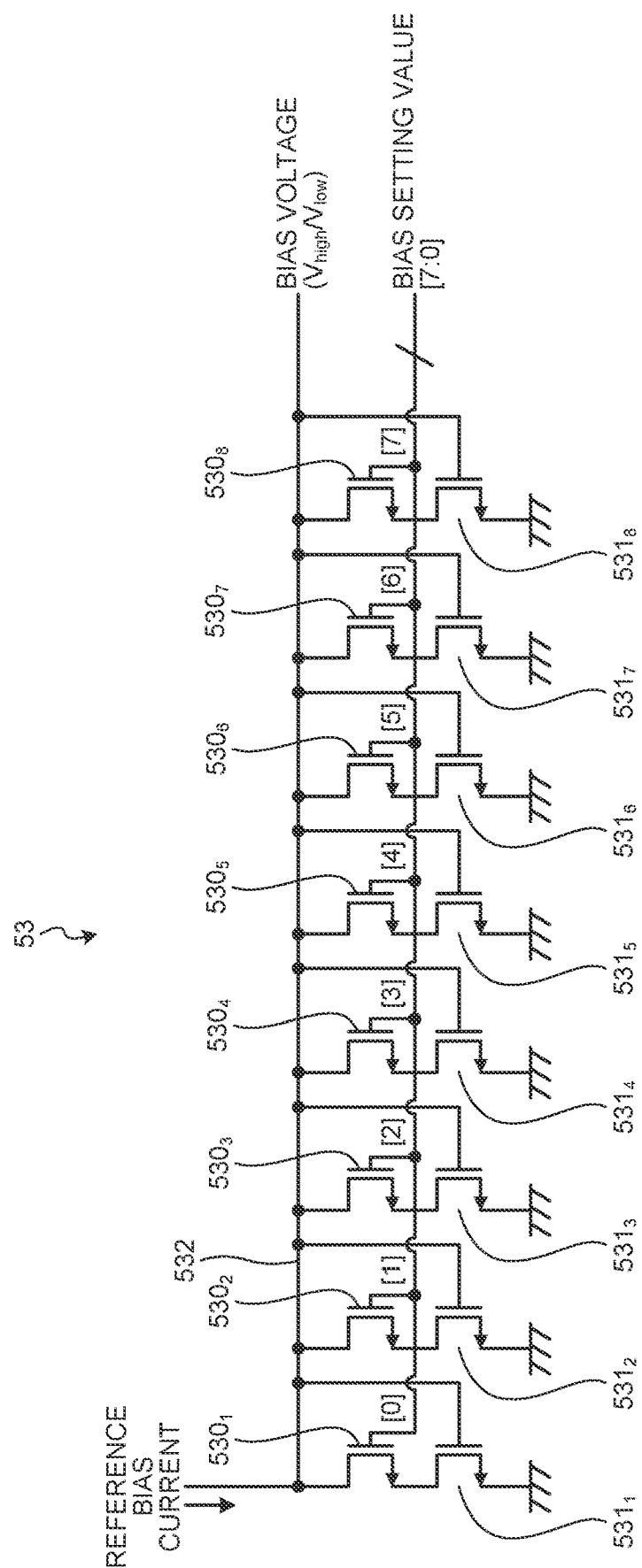
FIG. 14 is a diagram illustrating a structure of one example of a bias adjustment circuit that is applicable to the embodiment.

FIG. 14 is a diagram illustrating a structure of one example of the bias adjustment circuit 53 that is applicable to the embodiment. Note that the bias adjustment circuit 53 includes two of the circuits in FIG. 14, and is configured to be able to generate the bias voltages $V_{high}$ and $V_{low}$ independently. Here, these two circuits are not distinguished in order to avoid the complication, and the first bias setting value and the second bias setting value are collectively referred to as the bias setting value and the bias voltages $V_{high}$ and $V_{low}$ are collectively referred to as the bias voltage $V_{bias}$.

The bias adjustment circuit 53 illustrated in FIG. 14 includes transistors $530_1$ to $530_8$ that are turned on or off by the bias setting value, and transistors $531_1$ to $531_8$ that are diode-connected when the transistors $530_1$ to $530_8$ are turned on, respectively.

More specifically, drains of the transistors $530_1$ to $530_8$ are connected commonly to a bias voltage output line 532, and to gates thereof, bits of the bias setting values are supplied. For example, among the eight bits of the bias setting value, a 0-th bit is supplied to the gate of the transistor $530_1$, a first bit is supplied to the gate of the transistor $530_2$, a second bit is supplied to the gate of the transistor $530_3$, a third bit is supplied to the gate of the transistor $530_4$, a fourth bit is supplied to the gate of the transistor $530_5$, a fifth bit is supplied to the gate of the transistor $530_6$, a sixth bit is supplied to the gate of the transistor $530_7$, and a seventh bit is supplied to the gate of the transistor $530_8$.

To a source of the transistor $530_1$, a drain of the transistor $531_1$ is connected and the drain of the transistor $531_1$ is grounded. A gate of the transistor $531_1$ is connected to the bias voltage output line 532. In this manner, the transistor $531_1$ is diode-connected when the transistor $530_1$ is turned on, and when the transistor $530_1$ is turned off, the supply of the current to the drain is stopped.

The connection by a pair of the transistor $530_1$ and $531_1$ similarly applies to other pairs: a pair of $530_2$ and $531_2$, a pair of $530_3$ and $531_3$, a pair of $530_4$ and $531_4$, a pair of $530_5$ and $531_5$, a pair of $530_6$ and $531_6$, a pair of $530_7$ and $531_7$, and a pair of $530_8$ and $531_8$. Therefore, in order to avoid the complication, the description here is omitted.

In addition, the reference bias current is supplied to the bias voltage output line 532.

As described above, the calculation unit 52 supplies the bias setting value expressed by the number of bits with a value of "1" to the bias adjustment circuit 53. The bias adjustment circuit 53 selectively turns on the transistor, among the transistors $530_1$ to $530_8$, corresponding to the bit with a value of "1" in the supplied bias setting value and turns off the other transistors. Therefore, the circuit in which the diode-connected transistors are connected in parallel is formed. The number of transistors corresponds to the bits with a value of "1" among the transistors $530_1$ to $530_8$ for a certain reference bias current. Thus, the bias voltage output corresponding to the number of the values "1" in the bias setting value can be generated.

The two bias voltage outputs generated in the bias adjustment circuit 53, that is, the bias voltages $V_{high}$ and $V_{low}$ are supplied to the first comparator 331 and the second comparator 332 in the quantizer 330, respectively.

As described above, the solid imaging element 11a in the embodiment sets the threshold of the event detection on the basis of the temperature measurement value measured by the one or more temperature measurement circuits 51 disposed on the substrate where the photoelectric conversion element 402 is provided. Therefore, the detection sensitivity in the region with the low luminous intensity can be corrected, and the decrease in contrast sensitivity due to the deterioration in I-V conversion characteristic caused by the dark current can be reduced.

Figure 15:
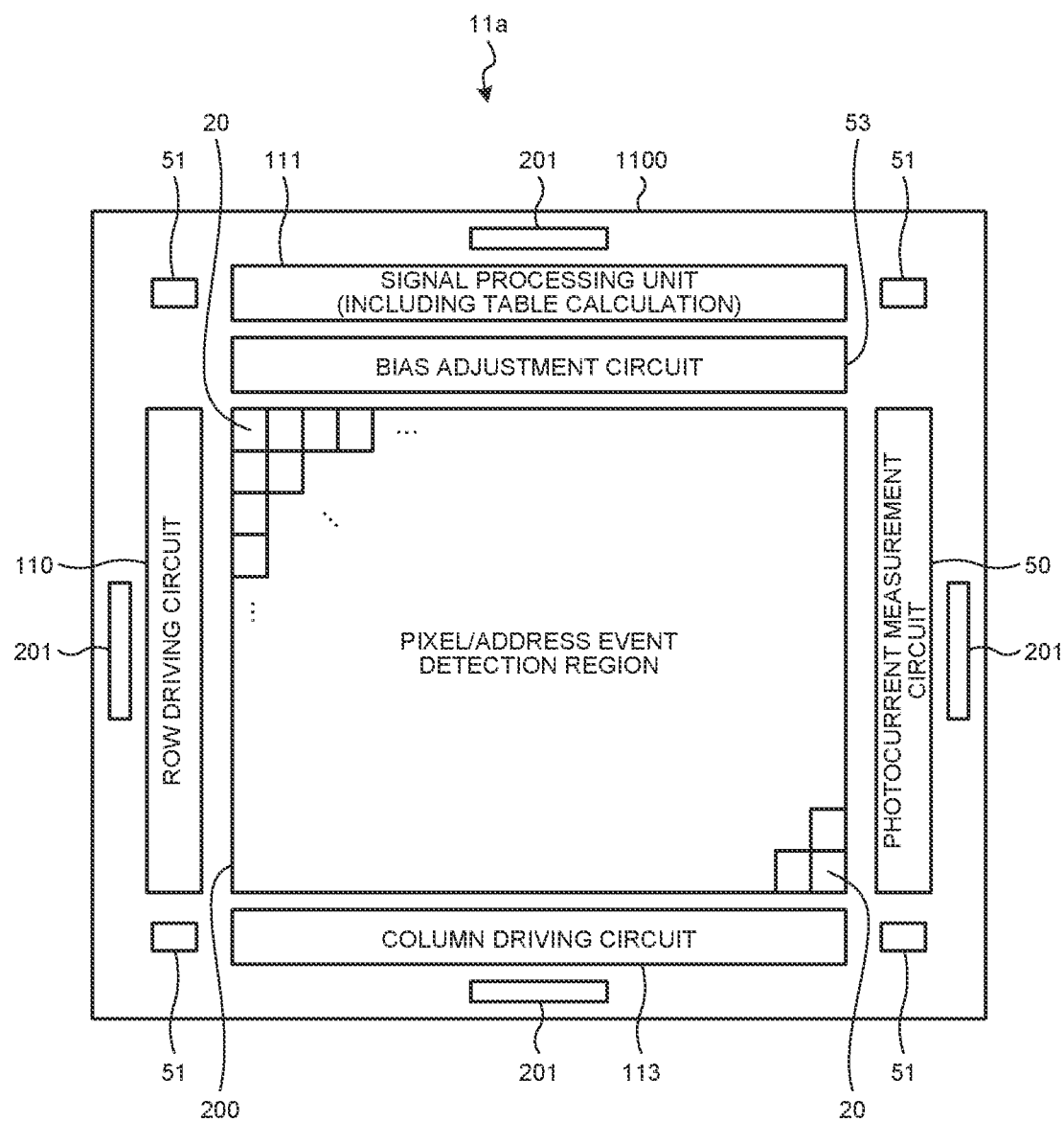
FIG. 15 is a diagram illustrating an example in which the solid imaging element is formed on one semiconductor chip.

Specific Arrangement Example of Temperature Measurement Circuit 51 in the Embodiment Next, the arrangement of the temperature measurement circuit 51 according to the embodiment on the substrate (semiconductor chip) is described. FIG. 15 is a diagram illustrating an example in which the solid imaging element 11a is formed on one semiconductor chip 1100.

In FIG. 15, the row driving circuit 110, the signal processing unit 111, the column driving circuit 113, a pixel/address event detection region 200, the photocurrent measurement circuit 50, one or more temperature measurement circuits 51, and the bias adjustment circuit 53 that are included in the solid imaging element 11a are disposed on the semiconductor chip 1100. The row driving circuit 110, the signal processing unit 111, and the column driving circuit 113, the photocurrent measurement circuit 50, the one or more temperature measurement circuits 51, and the bias adjustment circuit 53 are disposed around the pixel/address event detection region 200. On the outermost periphery of the semiconductor chip 1100, a pad 201 for electrically connecting to the outside is provided. In FIG. 15, the arbiter 112 may be included in the row driving circuit 110, for example.

The pixel/address event detection region 200 includes the pixels 20 arranged in the array form in accordance with the pixel array unit 114. Each of the pixels 20 includes the address event detection unit 30. The signal processing unit 111 includes the calculation unit 52. Note that the arrangement of the photocurrent measurement circuit 50, the calculation unit 52, and the bias adjustment circuit 53 is not limited to the arrangement illustrated in FIG. 15.

In the example in FIG. 15, the solid imaging element 11a includes four temperature measurement circuits 51, and these four temperature measurement circuits 51 are respectively provided at four corners of the semiconductor chip 1100. By arranging the temperature measurement circuits 51 dispersedly in the semiconductor chip 1100 in this manner, even if the heat generation from the semiconductor chip 1100 deviates spatially, the average temperature of the semiconductor chip 1100 can be measured. Note that it is preferable that the temperature measurement circuits 51 are disposed on the outer peripheral side of the pixel/address event detection region 200 and on the inner peripheral side of the pad 201.

Here, the bias adjustment circuit 53 supplies the bias voltages $V_{high}$ and $V_{low}$ commonly to the address event detection units 30 in the pixels 20 in the pixel/address event detection region 200.

In addition, the bias adjustment circuit 53 may supply the bias voltages $V_{high}$ and $V_{low}$ to a plurality of regions obtained by dividing the pixel/address event detection region 200. In this case, it is considered that the photocurrent measurement circuit 50, the calculation unit 52, and the bias adjustment circuit 53 are provided for each region.

That is to say, the photocurrent measurement circuit 50 in each region measures the total photocurrent $I_{ph}$ of the corresponding region among the regions where the pixel/address event detection region 200 is divided. The calculation unit 52 and the bias adjustment circuit 53 in each region obtain the bias voltages $V_{high}$ and $V_{low}$ on the basis of the output from the temperature measurement circuit 51 and the photocurrent measurement circuit 50 corresponding to the region, and apply the voltages to each address event detection unit 30 included in the region. With this structure, it is possible to deal with the spatial deviation of the heat generation of the semiconductor chip 1100 adaptively.

Other Example of Arrangement of Temperature Measurement Circuit

Figure 16A:
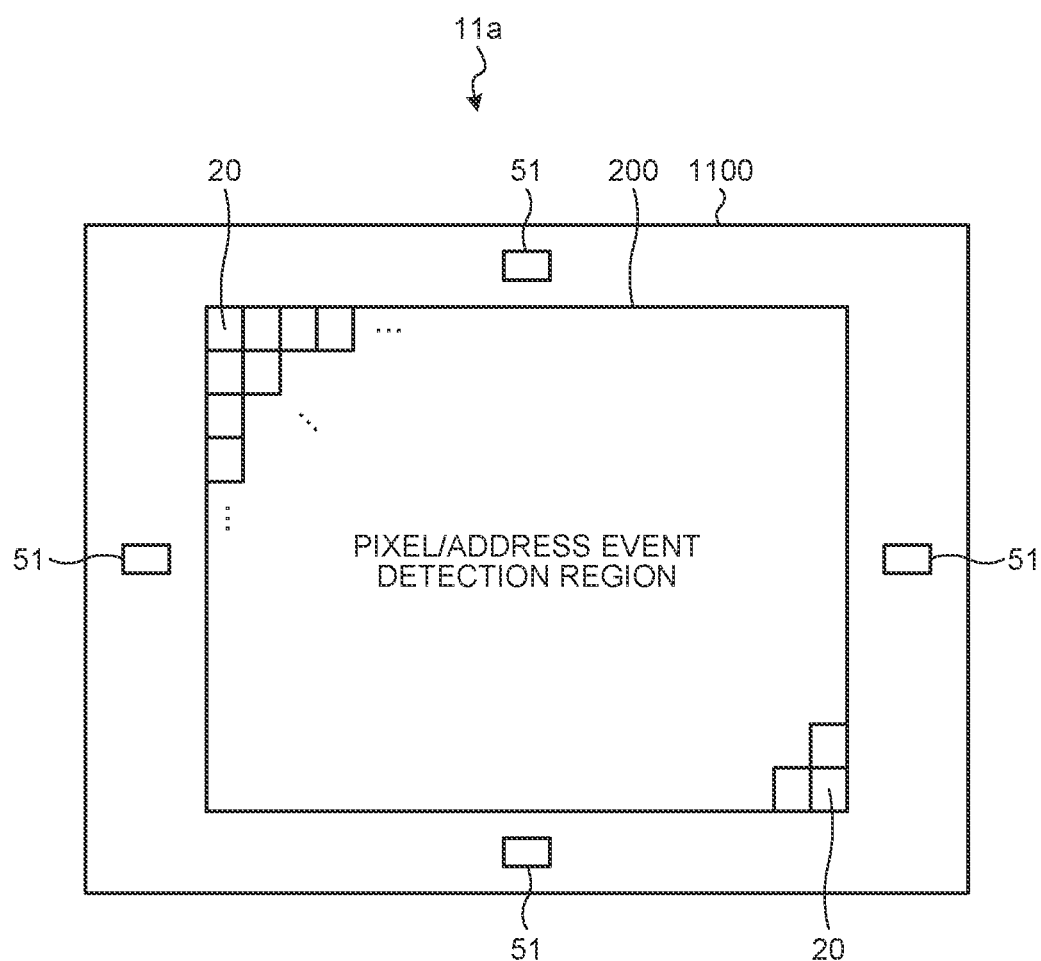
FIG. 16A is a diagram illustrating another example of the arrangement of a plurality of temperature measurement circuits that is applicable to the embodiment.
Figure 16B:
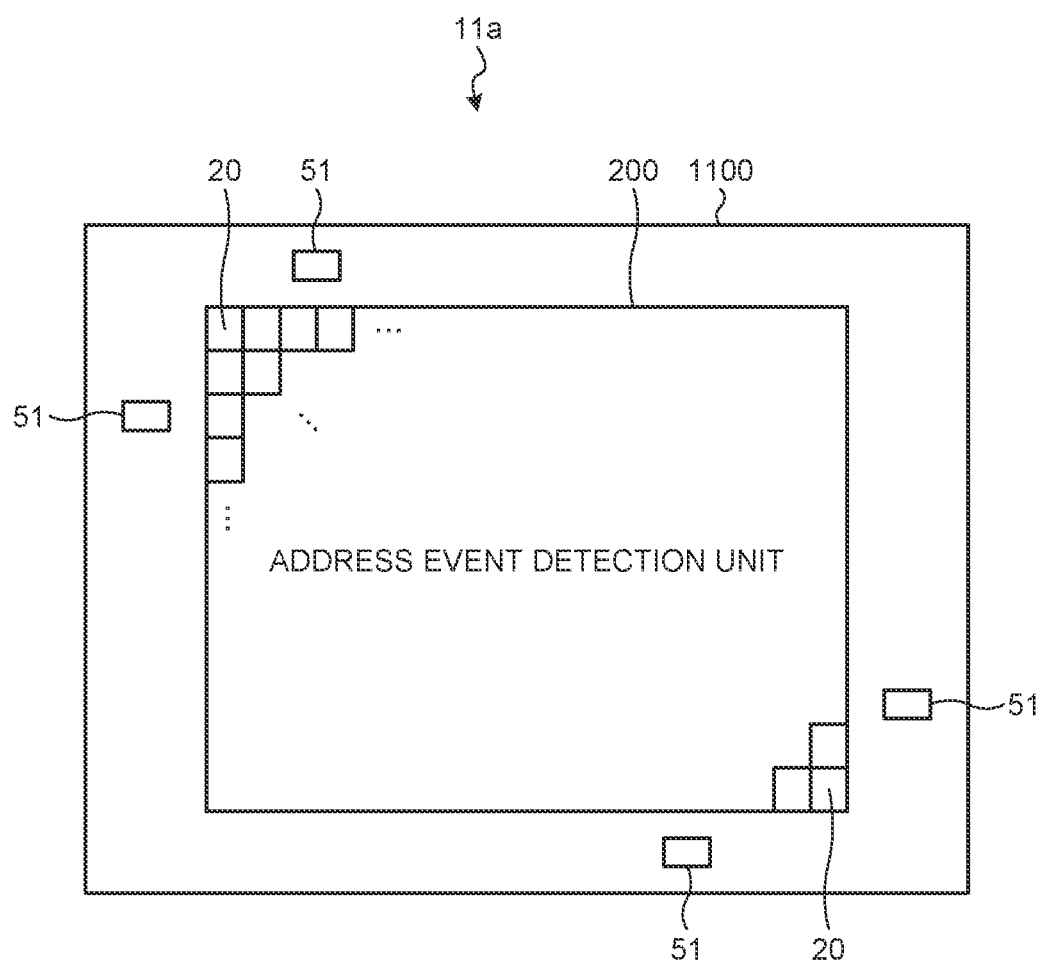
FIG. 16B is a diagram illustrating another example of the arrangement of the temperature measurement circuits that is applicable to the embodiment.

The arrangement of the temperature measurement circuits 51 is not limited to the example in FIG. 15. That is to say, the temperature measurement circuits 51 may have a different arrangement and it is only necessary that the temperature measurement circuits 51 are disposed dispersedly around the pixel/address event detection region 200 in the semiconductor chip 1100. FIGS. 16A, 16B, and 16C are diagrams illustrating other examples of the arrangement of the temperature measurement circuits 51 applicable to the embodiment. Note that the structures other than the pixel/address event detection region 200 (including pixels 20) and the temperature measurement circuits 51 are omitted in FIGS. 16A, 16B, and 16C.

In the examples in FIGS. 16A, 16B, and 16C, and in the example in FIG. 15 described above, the four temperature measurement circuits 51 are disposed at the respective sides of the semiconductor chip 1100. Here, each side includes one vertex of a rectangle that does not overlap. FIG. 16A illustrates the example in which each temperature measurement circuit 51 is disposed near a middle point of each side. FIG. 16B illustrates the example in which the temperature measurement circuits 51 are disposed close to two diagonal corners of the respective sides of the semiconductor chip 1100. FIG. 16C illustrates the example in which the temperature measurement circuits 51 are disposed asymmetrically at the respective sides.

Here, the four temperature measurement circuits 51 are disposed at the respective sides of the semiconductor chip 1100; however, the arrangement is not limited to this example. For example, a plurality of (for example, two) temperature measurement circuits 51 may be disposed with a predetermined distance therebetween along one side of the semiconductor chip 1100. Furthermore, the number of temperature measurement circuits 51 disposed in the semiconductor chip 1100 is not limited to four. That is to say, it is only necessary that at least one temperature measurement circuit 51 is disposed on the semiconductor chip 1100, and five or more temperature measurement circuits 51 may be disposed.

First Modification of Embodiment

Next, a first modification of the embodiment is described. In the aforementioned embodiment, the solid imaging element 11a is formed on one semiconductor chip 1100. In the first modification of the embodiment, the solid imaging element 11a is formed to have a two-layer structure in which semiconductor chips are stacked in two layers.

Figure 17:
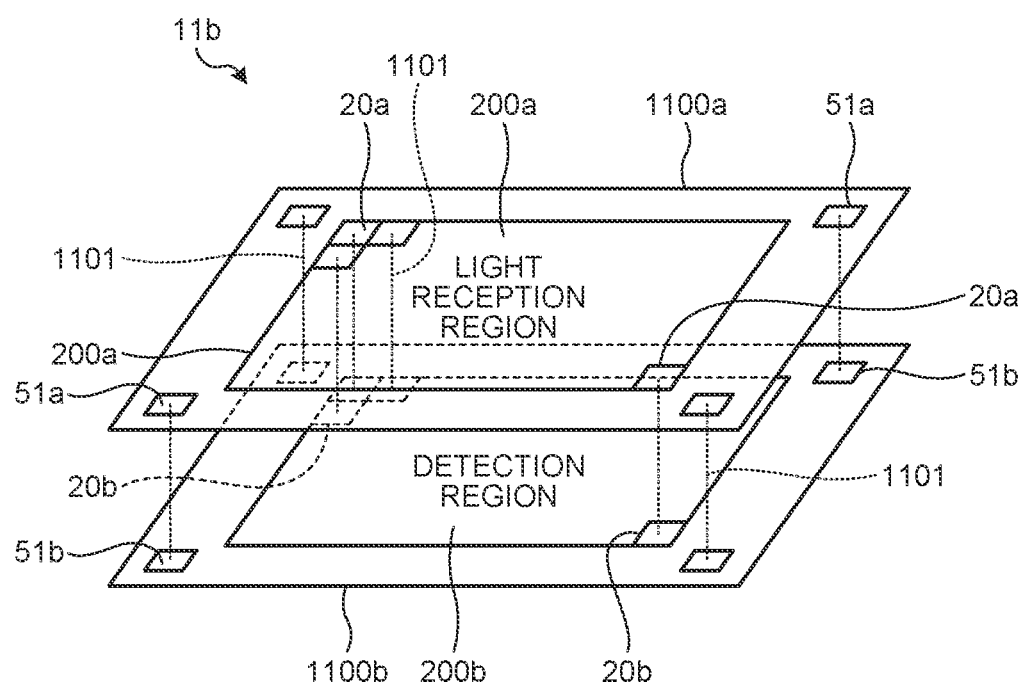
FIG. 17 is a diagram illustrating an example of a structure of a solid imaging element according to a first modification of the embodiment.

FIG. 17 is a diagram illustrating an example of the structure of the solid imaging element according to the first modification of the embodiment. In FIG. 17, a solid imaging element 11b is formed as one solid imaging element 11b by bonding a light reception chip 1100a, which is a semiconductor chip in a first layer, and a detection chip 1100b, which is a semiconductor chip in a second layer, to each other while bring these chips in electric contact through a conductive path 1101, for example. Note that the structure of the solid imaging element 11b is substantially the same as the structure of the solid imaging element 11a according to the embodiment described with reference to FIG. 2 to FIG. 4 and FIG. 8, for example; thus, the description is omitted here.

In the structure of FIG. 17, a light reception region 200a where light reception units 20a including photoelectric conversion elements 402 and their peripheral circuits are arranged in an array form and included in the address event detection unit 30 in the aforementioned pixel 20, and a sensing unit 51a constituting a part of the temperature measurement circuit 51 for sensing the temperature are disposed in the light reception chip 1100a. Moreover, a detection region 200b where detection units 20b included in the pixel 20 for detecting the address event are arranged in an array form, and a temperature measurement value output unit 51b that outputs in accordance with the temperature sensed in the sensing unit 51a in the temperature measurement circuit 51 are disposed in the detection chip 1100b.

In the structure of FIG. 17, the light reception region 200a where the light reception units 20a are arranged in the array form and the sensing units 51a are disposed in the light reception chip 1100a. The light reception unit 20a includes the photoelectric conversion element 402 and the peripheral circuit included in the address event detection unit 30 in the aforementioned pixel 20. The sensing unit 51a includes a structure for sensing the temperature, which is a part of the temperature measurement circuit 51.

Note that the arrangement examples of the temperature measurement circuits 51 on the semiconductor chip 1100, which are described with reference to FIGS. 15, 16A, 16B, and 16C, are applicable to the arrangement of the sensing units 51a on the light reception chip 1100a. That is to say, it is only necessary that the sensing units 51a are arranged dispersedly around the light reception region 200a in the light reception chip 1100a.

In the structure of FIG. 17, the detection region 200b where the detection units 20b are disposed in the array form and the temperature measurement value output units 51b are disposed in the detection chip 1100b. The detection unit 20b includes a circuit included in the aforementioned pixel 20 for detecting the address event. The temperature measurement value output unit 51b includes a circuit for outputting in accordance with the temperature sensed in the sensing unit 51a in the temperature measurement circuit 51.

In the detection chip 1100b, the row driving circuit 110, the signal processing unit 111, the arbiter 112, and the column driving circuit 113 can be disposed partially or entirely.

Figure 18:
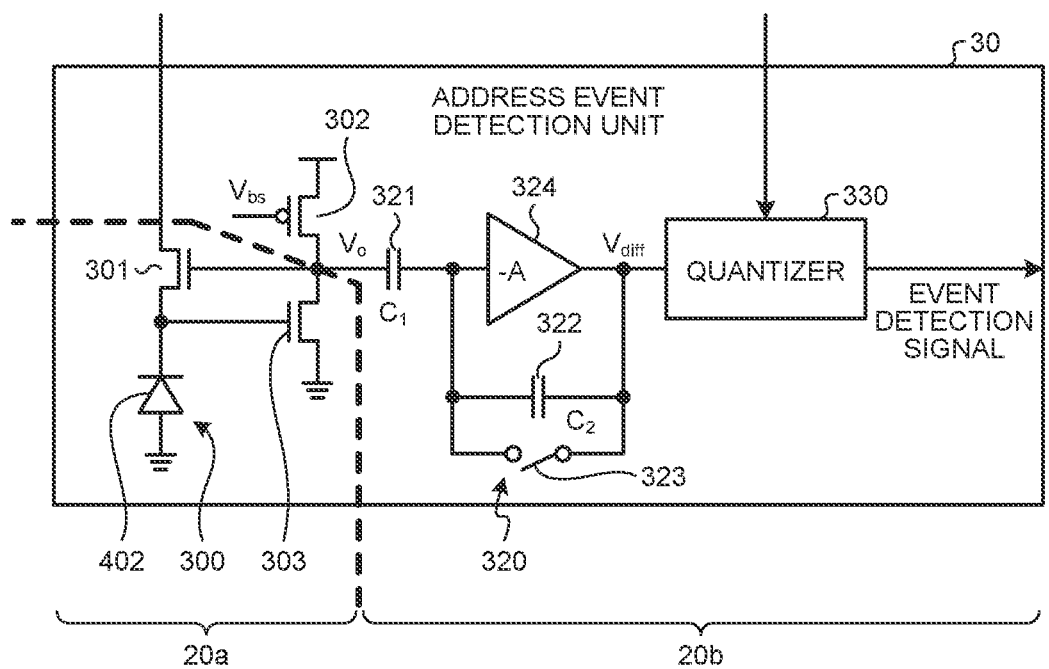
FIG. 18 is a diagram illustrating an example of a division position in a case where the address event detection unit is divided into a light reception unit and a detection unit, which is applicable to the first modification of the embodiment.

FIG. 18 is a diagram illustrating an example, which is applicable to the first modification of the embodiment, of the division position in a case where the address event detection unit 30 is divided into the light reception unit 20a and the detection unit 20b. In the example of FIG. 18, the structure including the transistors 301 and 303 and the photoelectric conversion element 402 is used as the light reception unit 20a, and the other part is used as the detection unit 20b in the address event detection unit 30. Moreover, the light reception unit 20a and the detection unit 20b are divided at positions of a connection point among the gate of the transistor 301, the drain of the transistor 302, the drain of the transistor 303, and the capacitor 321 in FIG. 18. By the division at this point, the light reception unit 20a and the detection unit 20b can be connected by one conductive path 1101 and the area can be saved.

Figure 19:
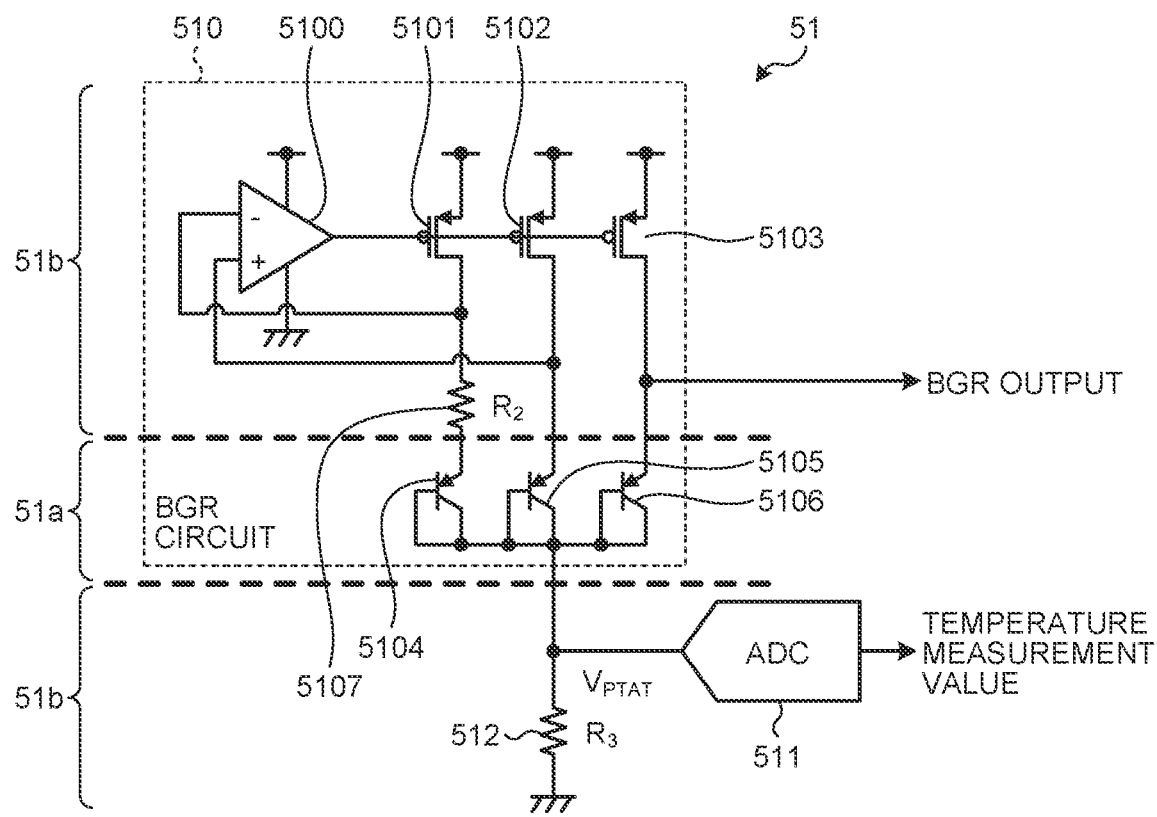
FIG. 19 is a diagram illustrating an example of a division position in a case where the temperature measurement circuit is divided into a sensing unit and a temperature measurement value output unit, which is applicable to the first modification of the embodiment.

FIG. 19 is a diagram illustrating an example, which is applicable to the first modification of the embodiment, of the division position in a case where the temperature measurement circuit 51 is divided into the sensing unit 51a and the temperature measurement value output unit 51b. In the example of FIG. 18, transistors 5104, 5105, and 5106 including the structure with temperature dependence are formed as the sensing unit 51a and the other parts are used as the temperature measurement value output unit 51b. Note that the connection point between the transistor 5103 and the transistor 5106 where the BGR output voltage is extracted in the BGR circuit 510 included in the temperature measurement circuit 51 can be provided on the detection chip 1100b, for example. Alternatively, the connection point may be provided on the light reception chip 1100*a* or to each of the light reception chip 1100*a* and the detection chip 1100*b*.

Second Modification of Embodiment

Next, a second modification of the embodiment is described. In the first modification of the embodiment described above, the sensing unit 51*a* of the temperature measurement circuit 51 is disposed on the light reception chip 1100*a* in the solid imaging element 11*b* formed of the two-layer structure. On the other hand, in the second modification of the embodiment, the temperature measurement circuit 51 including the sensing unit 51*a* is disposed on the detection chip 1100*b*.

Figure 20:
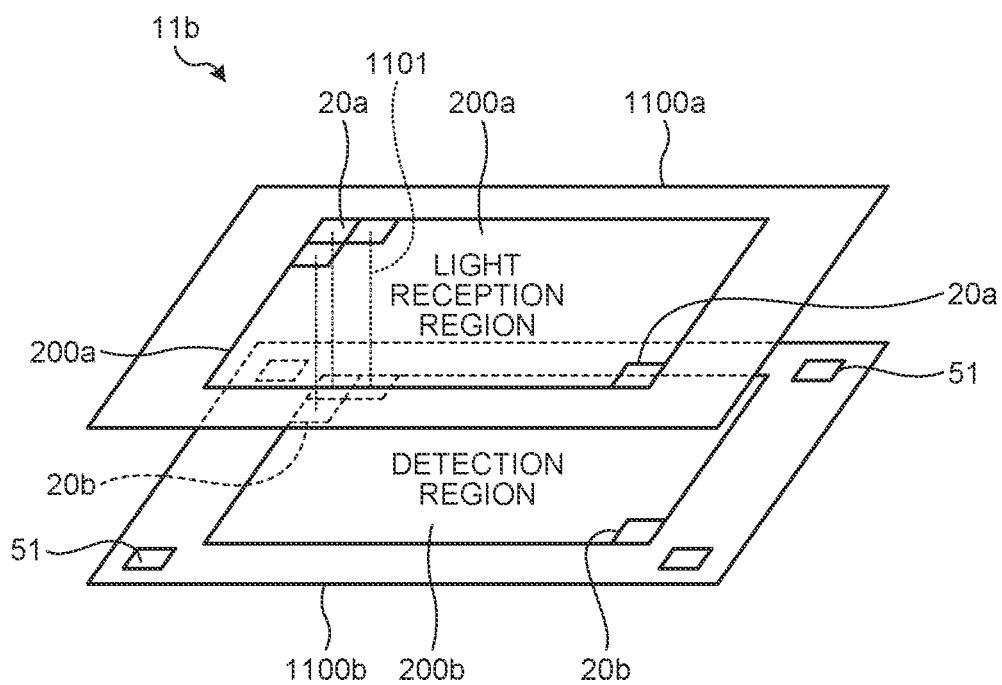
FIG. 20 is a diagram illustrating an example of a structure of a solid imaging element according to a second modification of the embodiment.

FIG. 20 is a diagram illustrating an example of the structure of the solid imaging element according to the second modification of the embodiment. In FIG. 20, the solid imaging element 11*b* is formed as one solid imaging element 11*b* by bonding the light reception chip 1100*a* and the detection chip 1100*b* to each other while bring these chips in electric contact through the conductive path 1101 in a manner similar to the solid imaging element 11*b* described with reference to FIG. 17.

In the structure in FIG. 20, the temperature measurement circuit 51 and the sensing unit 51*a* that senses the temperature in the temperature measurement circuit 51 are not disposed on the light reception chip 1100*a* where the light reception region 200*a* is formed. The temperature measurement circuit 51 including the sensing unit 51*a* is disposed on the detection chip 1100*b* where the detection region 200*b* is formed.

Note that the arrangement examples of the temperature measurement circuits 51 on the semiconductor chip 1100, which are described with reference to FIGS. 15, 16A, 16B, and 16C, are applicable to the arrangement of the temperature measurement circuits 51 including the sensing unit 51*a* on the detection chip 1100*b*. That is to say, it is only necessary that the temperature measurement circuits 51 each including the sensing unit 51*a* are arranged dispersedly around the detection region 200*b* in the detection chip 1100*b*.

Note that the effects described in the present specification are merely examples and are not limited to these examples, and other effects may be exhibited.

Note that the present technique can have the following structures.

(1) A solid imaging element comprising:
 a light reception element that outputs an electric signal in accordance with incident light;
 a detection unit that detects whether a change quantity of the electric signal output from the light reception element has exceeded a threshold, and outputs a detection signal expressing a detection result of the detection;
 a temperature measurement unit that measures temperature; and
 a setting unit that sets the threshold on the basis of the temperature measured by the temperature measurement unit.

(2) The solid imaging element according to (1), wherein the setting unit sets the threshold on the basis of the temperature and the electric signal output from the light reception element.

(3) The solid imaging element according to (2), wherein the setting unit sets the threshold using a value based on a total of values of the electric signals output from two or more of the light reception elements.

(4) The solid imaging element according to (2), wherein the setting unit performs the setting using a table in which the temperature, the value of the electric signal, and the threshold are associated with each other.

(5) The solid imaging element according to any one of (1) to (4), wherein
 the detection unit detects whether the change quantity in a direction where the value of the electric signal decreases has exceeded a first threshold in that direction, and whether the change quantity in a direction where the value of the electric signal increases has exceeded a second threshold in that direction, and
 the setting unit
  sets the first threshold on the basis of the temperature and the value of the electric signal using a first table in which the temperature, the value of the electric signal, and the first threshold are associated with each other, and
  sets the second threshold on the basis of the temperature and the value of the electric signal using a second table in which the temperature, the value of the electric signal, and the second threshold are associated with each other.

(6) The solid imaging element according to (1), wherein the setting unit performs the setting using a table in which the temperature and the threshold are associated with each other.

(7) The solid imaging element according to any one of (1) to (6), wherein a plurality of the temperature measurement units are dispersedly disposed between an outer periphery of a substrate where the light reception element is disposed and a region of the substrate where the light reception element is disposed.

(8) The solid imaging element according to (7), wherein four of the temperature measurement units are respectively disposed at sides each including one vertex of the substrate that does not overlap.

(9) The solid imaging element according to any one of (1) to (8), further comprising a first substrate and a second substrate that is stacked on the first substrate, wherein
 the light reception element and a sensing unit that senses at least temperature of the temperature measurement unit are disposed on the first substrate, and
 at least a part of the detection unit and at least a part of the setting unit are disposed on the second substrate.

(10) The solid imaging element according to any one of (1) to (6), further comprising a first substrate and a second substrate that is stacked on the first substrate, wherein
 the light reception element is disposed on the first substrate, and
 the temperature measurement unit, at least a part of the detection unit, and at least a part of the setting unit are disposed on the second substrate.

(11) The solid imaging element according to (10), wherein a plurality of the temperature measurement units are dispersedly disposed between an outer periphery of the second substrate and a region of the second substrate where at least a part of the detection unit and at least a part of the setting unit are disposed.

(12) The solid imaging element according to (10) or (11), wherein four of the temperature measurement units are respectively disposed at sides of the second substrate each including one vertex that does not overlap.

(13) A control method for a solid imaging element, comprising:
 an outputting step of causing a light reception element in a solid imaging element to output an electric signal in accordance with incident light;

a detecting step of causing a detection unit in the solid imaging element to detect whether a change quantity of the electric signal output from the light reception element has exceeded a threshold, and to output a detection signal expressing a detection result of the detection;

a measuring step of causing a temperature measurement unit in the solid imaging element to measure temperature; and a setting step of causing a setting unit in the solid imaging element to set the threshold on the basis of the temperature measured by the measuring step.

(14) The control method for a solid imaging element according to (13), wherein at the setting step, the threshold is set on the basis of the temperature and the electric signal output from the light reception element.

(15) The control method for a solid imaging element according to (14), wherein at the setting step, the threshold is set using a value based on a total of values of the electric signals output from two or more of the light reception elements.

(16) The control method for a solid imaging element according to (14), wherein at the setting step, the setting is performed using a table in which the temperature, the value of the electric signal, and the threshold are associated with each other.

(17) The control method for a solid imaging element according to any of (13) to (16), wherein at the detecting step, whether the change quantity in a direction where the value of the electric signal decreases has exceeded a first threshold in that direction, and whether the change quantity in a direction where the value of the electric signal increases has exceeded a second threshold in that direction are detected, and at the setting step, the first threshold is set on the basis of the temperature and the value of the electric signal using a first table in which the temperature, the value of the electric signal, and the first threshold are associated with each other and the second threshold is set on the basis of the temperature and the value of the electric signal using a second table in which the temperature, the value of the electric signal, and the second threshold are associated with each other.

(18) The control method for a solid imaging element according to (13), wherein at the setting step, the setting is performed using a table in which the temperature and the threshold are associated with each other.

(19) An electronic apparatus comprising:

a solid imaging element including a light reception element that outputs an electric signal in accordance with incident light, a detection unit that detects whether a change quantity of the electric signal output from the light reception element has exceeded a threshold, and outputs a detection signal expressing a detection result of the detection, a temperature measurement unit that measures temperature, and a setting unit that sets the threshold on the basis of the temperature measured by the temperature measurement unit; and a storage unit that stores the detection signal output from the detection unit.

(20) The electronic apparatus according to (19), wherein the setting unit sets the threshold on the basis of the temperature and the electric signal output from the light reception element.

(21) The electronic apparatus according to (20), wherein the setting unit sets the threshold using a value based on a total of values of the electric signals output from two or more of the light reception elements.

(22) The electronic apparatus according to (20), wherein the setting unit performs the setting using a table in which the temperature, the value of the electric signal, and the threshold are associated with each other.

(23) The electronic apparatus according to any of (19) to (22), wherein the detection unit detects whether the change quantity in a direction where the value of the electric signal decreases has exceeded a first threshold in that direction, and whether the change quantity in a direction where the value of the electric signal increases has exceeded a second threshold in that direction, and the setting unit sets the first threshold on the basis of the temperature and the value of the electric signal using a first table in which the temperature, the value of the electric signal, and the first threshold are associated with each other and sets the second threshold on the basis of the temperature and the value of the electric signal using a second table in which the temperature, the value of the electric signal, and the second threshold are associated with each other.

(24) The electronic apparatus according to (19), wherein the setting unit performs the setting using a table in which the temperature and the threshold are associated with each other.

(25) The electronic apparatus according to any of (19) to (24), wherein a plurality of the temperature measurement units are dispersedly disposed between an outer periphery of a substrate where the light reception element is disposed and a region of the substrate where the light reception element is disposed.

(26) The electronic apparatus according to (25), wherein four of the temperature measurement units are respectively disposed at sides each including one vertex of the substrate that does not overlap.

(27) The electronic apparatus according to any of (19) to (26), the solid imaging element including a first substrate and a second substrate that is stacked on the first substrate, wherein the light reception element and a sensing unit that senses at least temperature of the temperature measurement unit are disposed on the first substrate, and at least a part of the detection unit and at least a part of the setting unit are disposed on the second substrate.

(28) The electronic apparatus according to any of (19) to (24), the solid imaging element including a first substrate and a second substrate that is stacked on the first substrate, wherein the light reception element is disposed on the first substrate, and the temperature measurement unit, at least a part of the detection unit, and at least a part of the setting unit are disposed on the second substrate.

(29) The electronic apparatus according to (28), wherein in the solid imaging element, a plurality of the temperature measurement units are dispersedly disposed between an outer periphery of the second substrate and a region of the second substrate where at least a part of the detection unit and at least a part of the setting unit are disposed.

(30) The electronic apparatus according to (28) or (29), wherein in the solid imaging element, four of the temperature measurement units are respectively disposed at sides of the second substrate each including one vertex that does not overlap.

REFERENCE SIGNS LIST

1 IMAGING DEVICE
11, 11a, 11b SOLID IMAGING ELEMENT
20 PIXEL
20a, 40 LIGHT RECEPTION UNIT
20b DETECTION UNIT
30 ADDRESS EVENT DETECTION UNIT
50 PHOTOCURRENT MEASUREMENT CIRCUIT
51 TEMPERATURE MEASUREMENT CIRCUIT
51a SENSING UNIT
51b TEMPERATURE MEASUREMENT VALUE OUTPUT UNIT
52 CALCULATION UNIT
53 BIAS ADJUSTMENT CIRCUIT
110 ROW DRIVING CIRCUIT
111 SIGNAL PROCESSING UNIT
112 ARBITER
113 COLUMN DRIVING CIRCUIT
114 PIXEL ARRAY UNIT
200 PIXEL/ADDRESS EVENT DETECTION REGION
200a LIGHT RECEPTION REGION
200b DETECTION REGION
201 PAD
300 CURRENT-VOLTAGE CONVERSION UNIT
320 SUBTRACTION UNIT
330 QUANTIZER
331 FIRST COMPARATOR
332 SECOND COMPARATOR
402 PHOTOELECTRIC CONVERSION ELEMENT
510 BGR CIRCUIT
513 LIGHT-BLOCKING PIXEL
520, 521 TABLE
1100 SEMICONDUCTOR CHIP
1100a LIGHT RECEPTION CHIP
1100b DETECTION CHIP
1101 CONDUCTIVE PATH

The invention claimed is:

1. A solid imaging element, comprising:
a light reception element configured to output an electric signal in accordance with incident light;
a detection unit configured to:
  detect whether a change quantity of the electric signal output from the light reception element has exceeded a threshold; and
  output a detection signal expressing a detection result of the detection;
a temperature measurement unit configured to measure temperature; and
a setting unit configured to set the threshold based on the temperature measured by the temperature measurement unit.

2. The solid imaging element according to claim 1, wherein the setting unit is further configured to set the threshold based on the temperature and the electric signal output from the light reception element.

3. The solid imaging element according to claim 2, wherein the setting unit is further configured to set the threshold using a value based on a total of values of the electric signals output from at least two light reception elements.

4. The solid imaging element according to claim 2, wherein the setting unit is further configured to set the threshold using a table in which the temperature, the value of the electric signal, and the threshold are associated with each other.

5. The solid imaging element according to claim 1, wherein
the detection unit is further configured to detect whether the change quantity in a direction where a value of the electric signal decreases has exceeded a first threshold in that direction, and whether the change quantity in a direction where the value of the electric signal increases has exceeded a second threshold in that direction, and
the setting unit is further configured to:
  set the first threshold based on the temperature and the value of the electric signal using a first table in which the temperature, the value of the electric signal, and the first threshold are associated with each other, and
  set the second threshold based on the temperature and the value of the electric signal using a second table in which the temperature, the value of the electric signal, and the second threshold are associated with each other.

6. The solid imaging element according to claim 1, wherein the setting unit is further configured to set the threshold using a table in which the temperature and the threshold are associated with each other.

7. The solid imaging element according to claim 1, wherein a plurality of the temperature measurement units are dispersedly disposed between an outer periphery of a substrate where the light reception element is disposed and a region of the substrate where the light reception element is disposed.

8. The solid imaging element according to claim 7, wherein four of the temperature measurement units are respectively disposed at sides each including one vertex of the substrate that does not overlap.

9. The solid imaging element according to claim 1, further comprising:
a first substrate; and
a second substrate that is stacked on the first substrate, wherein
  the light reception element and a sensing unit, that senses the temperature, of the temperature measurement unit are disposed on the first substrate, and
  at least a part of the detection unit and at least a part of the setting unit are disposed on the second substrate.

10. The solid imaging element according to claim 1, further comprising:
a first substrate; and
a second substrate that is stacked on the first substrate, wherein
  the light reception element is disposed on the first substrate, and
  the temperature measurement unit, at least a part of the detection unit, and
at least a part of the setting unit are disposed on the second substrate.

11. The solid imaging element according to claim 10, wherein a plurality of the temperature measurement units are dispersedly disposed between an outer periphery of the second substrate and a region of the second substrate where at least a part of the detection unit and at least a part of the setting unit are disposed.

12. The solid imaging element according to claim 10, wherein four temperature measurement units are respectively disposed at sides of the second substrate each including one vertex that does not overlap.

13. A control method for a solid imaging element, comprising:
   in the solid imaging element that comprises a light reception element, a detection unit, a temperature measurement unit, and a setting unit:
   outputting, by the light reception element, an electric signal in accordance with incident light;
   detecting, by the detection unit, whether a change quantity of the electric signal output from the light reception element has exceeded a threshold;
   outputting, by the detection unit, detection signal expressing a detection result of the detection;
   measuring, by the temperature measurement unit, a temperature; and
   setting, by the setting unit, the threshold based on the temperature measured by the temperature measurement unit.

14. An electronic apparatus, comprising:
   a solid imaging element including:
      a light reception element configured to output an electric signal in accordance with incident light,
      a detection unit configured to:
         detect whether a change quantity of the electric signal output from the light reception element has exceeded a threshold; and
         output a detection signal expressing a detection result of the detection,
      a temperature measurement unit configured to measure temperature, and
      a setting unit configured to set the threshold based on the temperature measured by the temperature measurement unit; and
   a storage unit configured to store the detection signal output from the detection unit.

* * * * *